US012588479B2

(12) United States Patent
Togashi

(10) Patent No.: US 12,588,479 B2
(45) Date of Patent: Mar. 24, 2026

(54) SOLID-STATE IMAGE SENSOR, AND ELECTRONIC DEVICE

(71) Applicant: SONY SEMICONDUCTOR SOLUTIONS CORPORATION, Kanagawa (JP)

(72) Inventor: Hideaki Togashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/764,951

(22) PCT Filed: Sep. 28, 2016

(86) PCT No.: PCT/JP2016/004369
§ 371 (c)(1),
(2) Date: Mar. 30, 2018

(87) PCT Pub. No.: WO2017/061082
PCT Pub. Date: Apr. 13, 2017

(65) Prior Publication Data
US 2018/0286922 A1      Oct. 4, 2018

(30) Foreign Application Priority Data

Oct. 6, 2015      (JP) ................................. 2015-198347

(51) Int. Cl.
*H01L 21/768*      (2006.01)
*H01L 23/48*      (2006.01)
(Continued)

(52) U.S. Cl.
CPC ...... *H01L 21/76898* (2013.01); *H01L 23/481* (2013.01); *H10F 39/1825* (2025.01);
(Continued)

(58) Field of Classification Search
CPC ............. H01L 27/146; H01L 21/76898; H01L 27/14636; H01L 23/481; H01L 27/14621;
(Continued)

(56) References Cited

U.S. PATENT DOCUMENTS

2008/0283951 A1      11/2008   Nabe
2009/0140365 A1      6/2009   Lee et al.
(Continued)

FOREIGN PATENT DOCUMENTS

EP      2802005      11/2014
JP      4491323      5/2006
(Continued)

OTHER PUBLICATIONS

International Search Report and Written Opinion prepared by the European Patent Office on Dec. 7, 2016, for International Application No. PCT/JP2016/004369.
(Continued)

*Primary Examiner* — Samuel A Gebremariam
*Assistant Examiner* — Jonas T Beardsley
(74) *Attorney, Agent, or Firm* — Sheridan Ross PC

(57)      ABSTRACT

There is provided an image sensor including a semiconductor substrate having a first side and a second side and a photoelectric conversion element disposed at the first side of the semiconductor substrate. In addition, a through electrode is coupled to the photoelectric conversion element, where the through electrode includes a conductive portion and an insulating film. A thickness of the insulating film between the semiconductor substrate and the conductive portion at the first side of the semiconductor substrate is different than the thickness of the insulting film between the semiconductor substrate and the conductive portion at the second side of the semiconductor substrate.

20 Claims, 19 Drawing Sheets

(51) Int. Cl.

| | | |
|---|---|---|
| *H10F 39/00* | (2025.01) | |
| *H10F 39/12* | (2025.01) | |
| *H10F 39/18* | (2025.01) | |
| *H10K 19/20* | (2023.01) | |
| *H10K 30/83* | (2023.01) | |
| *H10K 39/32* | (2023.01) | |

(52) U.S. Cl.
CPC ......... *H10F 39/191* (2025.01); *H10F 39/199* (2025.01); *H10F 39/8037* (2025.01); *H10F 39/811* (2025.01); *H10F 39/812* (2025.01); *H10K 19/20* (2023.02); *H10K 30/83* (2023.02); *H10K 39/32* (2023.02)

(58) Field of Classification Search
CPC ......... H01L 27/14643; H01L 21/76804; H01L 21/76831; H10F 39/811; H10F 39/199; H10F 39/18
See application file for complete search history.

(56) References Cited

U.S. PATENT DOCUMENTS

| | | | |
|---|---|---|---|
| 2011/0272772 A1* | 11/2011 | Kokubun | ............... H10K 39/32 257/E31.127 |
| 2013/0168750 A1 | 7/2013 | Ikhlef | |
| 2013/0277789 A1* | 10/2013 | Chen | ..................... H10F 39/811 438/98 |
| 2015/0115389 A1* | 4/2015 | Chuang | .............. H01L 27/1464 257/774 |
| 2015/0179612 A1* | 6/2015 | Tsai | ........................ H01L 24/24 257/773 |
| 2015/0179613 A1* | 6/2015 | Tsai | ........................ H01L 24/92 257/773 |
| 2015/0188065 A1 | 7/2015 | Takimoto | |
| 2015/0255498 A1* | 9/2015 | Sugiura | ............... H10F 39/8053 257/432 |
| 2017/0077431 A1* | 3/2017 | Mizuno | .................. H10K 39/32 |
| 2018/0069145 A1* | 3/2018 | Ishida | ................... H01L 23/532 |

FOREIGN PATENT DOCUMENTS

| | | |
|---|---|---|
| JP | 2006120921 A | 5/2006 |
| JP | 2008-288309 | 11/2008 |
| JP | 2010-278086 | 12/2010 |
| JP | 2011-029337 | 2/2011 |
| JP | 2011-082291 | 4/2011 |
| JP | 2011-138927 | 7/2011 |
| JP | 2011187544 A | 9/2011 |
| JP | 2011-204915 | 10/2011 |
| JP | 2011-238658 | 11/2011 |
| JP | 2013-140916 | 7/2013 |
| JP | 2013-140975 | 7/2013 |
| JP | 2015038931 A | 2/2015 |
| JP | 2015-050331 | 3/2015 |
| KR | 20150066527 A | 6/2015 |
| KR | 20150104010 A | 9/2015 |
| WO | WO 2005/101476 | 10/2005 |
| WO | WO 2014/002852 | 1/2014 |
| WO | WO 2014/021177 | 2/2014 |

OTHER PUBLICATIONS

Gambino, Jeffrey P. et al: "An overview of through-silicon-via technology and manufacturing challenges", Micoelectronic Engineering., vol. 135, Jan. 8, 2015, pp. 73-106.
Official Action (with English translation) for Japanese Patent Application No. 2015-198347, dated Oct. 15, 2019, 16 pages.

\* cited by examiner

14 THROUGH ELECTRODE DIAMETER THIN

17 CONDUCTOR

16 INSULATING FILM
(TAPER SHAPE)

THROUGH ELECTRODE DIAMETER THICK

10 SEMICONDUCTOR
SUBSTRATE

14 THROUGH ELECTRODE DIAMETER CONSTANT

16 INSULATING
FILM

21 P IMPURITY
(TAPER SHAPE)

THROUGH ELECTRODE DIAMETER CONSTANT

10 SEMICONDUCTOR
SUBSTRATE

SOLID-STATE IMAGE SENSOR, AND ELECTRONIC DEVICE

CROSS REFERENCE TO RELATED APPLICATIONS

This application is a national stage application under 35 U.S.C. 371 and claims the benefit of PCT Application No. PCT/JP2016/004369 having an international filing date of 28 Sep. 2016, which designated the United States, which PCT application claimed the benefit of Japanese Priority Patent Application JP 2015-198347 filed Oct. 6, 2015, the entire disclosures of each of which are incorporated herein by reference.

TECHNICAL FIELD

The present disclosure relates to a solid-state image sensor and an electronic device, and particularly relates to a solid-state image sensor and an electronic device that are preferable to use when providing a through electrode that penetrates a semiconductor substrate.

BACKGROUND ART

There is a problem that a false color is likely to be generated in a structure in which each pixel is covered by a color filter of one of R, G, and B, which is widely employed in image sensors of the past.

As a method that solves this problem, there is a proposal of a structure in which photoelectric conversion regions (photo diode (PD), etc.) that photoelectrically convert light of respective wavelengths of R (RED), G (GREEN), and B (BLUE) are layered in a vertical direction in each pixel region (for example, refer to Patent Literature 1).

Also, there is a proposal of a structure that provides a photoelectric conversion region (a photoelectric conversion film, etc.) outside a semiconductor substrate (for example, refer to Patent Literature 2 or 3).

When this structure is applied to a back-side illuminated solid-state image sensor, there is a known structure in which a through electrode that penetrates a semiconductor substrate is provided to transfer electric charge obtained by a photoelectric conversion film of a back surface side to a front surface side of the semiconductor substrate (for example, refer to Patent Literature 4).

CITATION LIST

Patent Literature

PTL 1: JP 04491323B
PTL 2: JP 2010-278086A
PTL 3: JP 2011-138927A
PTL 4: JP 2011-29337A

SUMMARY OF INVENTION

Technical Problem

When the through electrode is provided in the semiconductor substrate of the solid-state image sensor, the following problem can occur.

In general, in the through electrode its center part is formed of a conductor, and an insulating film is formed between the conductor and the semiconductor substrate. The through electrode penetrates the semiconductor substrate, and is connected to a modulation transistor and a floating diffusion (FD). Hence, electrostatic capacitance is generated between the through electrode and the semiconductor substrate, and there is a problem: if this electrostatic capacitance is large, conversion efficiency decreases, and the quality of obtained pixel signals decreases. Note that enlarging the distance between the through electrode and the semiconductor substrate is a comparatively easy measure in order to reduce the electrostatic capacitance but, in that case, the area of the through electrode becomes large, and the element area is enlarged.

The present disclosure is made in view of the above situation, and can improve pixel characteristics by reducing the electrostatic capacitance of the through electrode.

Solution to Problem

According to an embodiment of the present disclosure, there is provided an imaging device including a semiconductor substrate having a first side and a second side. The imaging device includes a photoelectric conversion element disposed at the first side of the semiconductor substrate and a through electrode coupled to the photoelectric conversion element, where the through electrode includes a conductive portion and an insulating film. Further, a thickness of the insulating film between the semiconductor substrate and the conductive portion at the first side of the semiconductor substrate is different than the thickness of the insulting film between the semiconductor substrate and the conductive portion at the second side of the semiconductor substrate.

According to an embodiment of the present disclosure, there is provided an electronic device including an image sensor. The image sensor includes a semiconductor substrate having a first side and a second side, a photoelectric conversion element disposed at the first side of a semiconductor substrate, and a through electrode coupled to the photoelectric conversion element, where the through electrode includes a conductive portion and an insulating film. A thickness of the insulating film between the semiconductor substrate and the conductive portion at the first side of the semiconductor substrate is different than the thickness of the insulting film between the semiconductor substrate and the conductive portion at the second side of the semiconductor substrate.

According to an embodiment of the present disclosure, there is provided an imaging device including a semiconductor substrate having a first side and a second side and a photoelectric conversion element disposed at the first side of the semiconductor substrate. A through electrode is coupled to the photoelectric conversion element, where the through electrode includes a conductive portion and an insulating film. A cross-sectional area of the through electrode at the first side of the semiconductor substrate is different than the cross-sectional area of the through electrode at the second side of the semiconductor substrate.

Advantageous Effects of Invention

According to an embodiment of the present disclosure, the electrostatic capacitance of the through electrode can be reduced, and the pixel characteristics can be improved.

DESCRIPTION OF EMBODIMENTS

In the following, the best mode for carrying out the present disclosure (hereinafter, referred to as "embodiment") will be described in detail with reference to the drawings.

Overview of Present Disclosure

First, an overview of an embodiment of the present disclosure will be described with reference to FIGS. 1 and 2.

Figure 1:
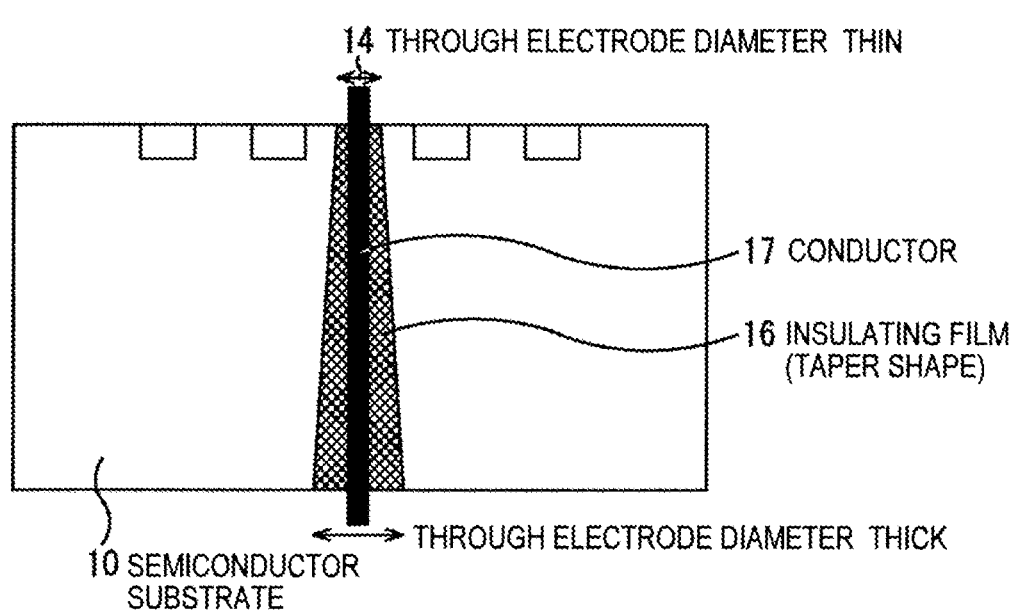
FIG. 1 is a diagram for describing an overview of an embodiment of the present disclosure.

FIG. 1 is a cross-sectional view illustrating a first exemplary configuration of a through electrode that is formed to reduce electrostatic capacitance as compared with previous methods.

In the first exemplary configuration, the outer diameter of a through electrode 14 formed in the semiconductor substrate 10 is formed thick at a surface side that has a spare element area, and is formed thin at a side that has no spare element area (in FIG. 1, thick at the lower side, and thin at the upper side). That is, the through electrode is formed in a taper shape (a tapering-off shape) in the vertical direction. The angle of the taper shape is in the range of 90 degrees to 70 degrees.

With regard to the through electrode 14, an insulating film 16 is formed around a conductor 17 of a constant thickness. In the case of the first exemplary configuration, the area occupied by the through electrode 14 at the upper side in the drawing, which has no spare element area, can be made small. Also, the film thickness of the insulating film 16 at the lower side in the drawing, which has a spare element area, is formed thick, and thereby reduction of electrostatic capacitance is achieved. Moreover, a cross-sectional area of the through electrode 14 may differ from an upper side to a lower side of the semiconductor substrate 10. That is, the cross-sectional area of the through electrode 14 at the first side of the semiconductor substrate 10 is different than the cross-sectional area of the through electrode 14 at the second side of the semiconductor substrate. Such change in cross-sectional area may be due to a change in the cross-sectional area of conductor 17, a change in the cross-sectional area of insulating film 16, or a combination of a change in the cross-sectional area of the conductor 17 and a change in the cross-sectional area of the insulating film 16.

Figure 2:
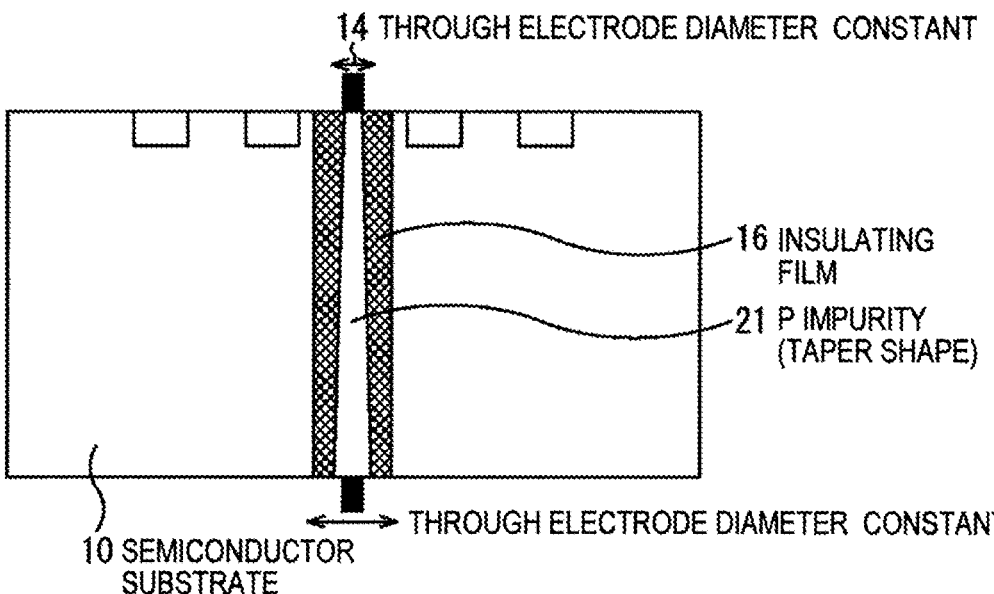
FIG. 2 is a diagram for describing an overview of an embodiment of the present disclosure.

FIG. 2 is a cross-sectional view illustrating a second exemplary configuration of the through electrode 14 that is formed to reduce the electrostatic capacitance as compared with previous methods.

In the second exemplary configuration, a through hole of a ring shape (doughnut shape) that has a constant outer diameter and a taper shape (in FIG. 2, the lower side is wide, and the upper side is narrow) is formed on the semiconductor substrate 10, and the insulating film 16 is filled there. Further, the through electrode 14 is formed and includes a conductive part whose resistance value is decreased by doping P impurity 21 into the semiconductor of the center part of the ring shape. In the case of the second exemplary configuration, the film thickness of the insulating film 16 at the upper side of the drawing is formed thick, and thereby reduction of electrostatic capacitance is achieved. Further, the area of the conductive part (the semiconductor in which the P impurity 21 is filled) is made wide at the lower side in the drawing, and thereby an overlap margin with a contact can be enlarged at the lower side in the drawing.

<First Exemplary Configuration of Back-Side Illuminated Solid-State Image Sensor that Employs Present Disclosure>

Next, an exemplary configuration of a back-side illuminated solid-state image sensor that employs an embodiment of the present disclosure, in which the through electrode 14 illustrated in FIG. 1 or 2 is formed, will be described.

Figure 3:
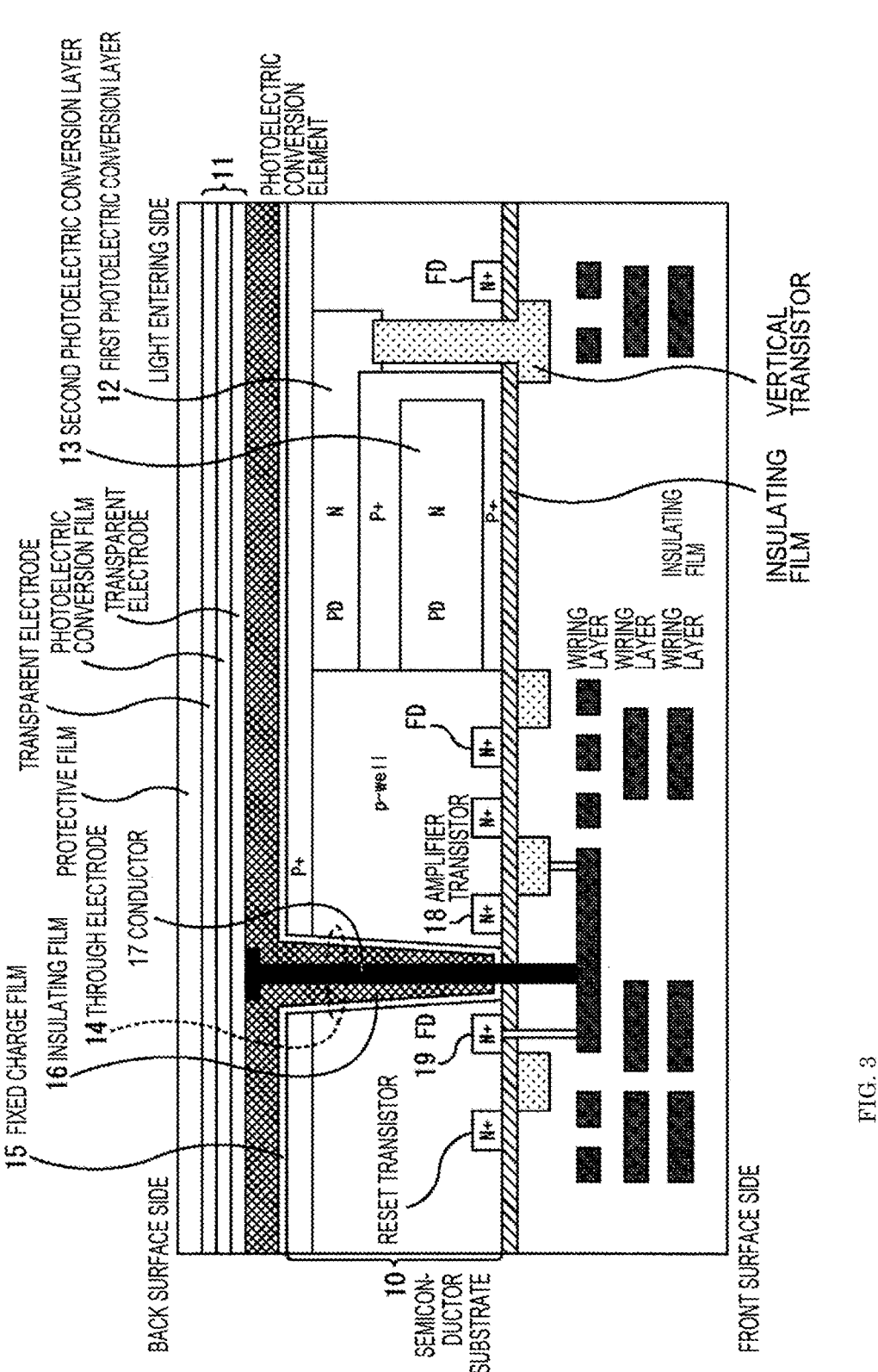
FIG. 3 is a cross-sectional view illustrating a first exemplary configuration of a back-side illuminated solid-state image sensor that employs an embodiment of the present disclosure.

FIG. 3 illustrates a first exemplary configuration, corresponding to one pixel, of the back-side illuminated solid-state image sensor that employs an embodiment of the present disclosure, which employs the structure of the through electrode 14 illustrated in FIG. 1.

In the first exemplary configuration illustrated in FIG. 3, a first photoelectric conversion layer 12 and a second photoelectric conversion layer formed of PDs in the semiconductor substrate 10 is formed, and a fixed charge film 15 that includes a negative fixed charge is formed directly above the first photoelectric conversion layer 12.

The fixed charge film 15 can employ hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, aluminum nitride film, hafnium oxynitride film, aluminum oxynitride film, or the like, for example. Note that two or more layers of fixed charge films of different materials may be layered.

The insulating film 16 is formed at the upper side of the fixed charge film 15. The insulating film 16 can employ dielectrics that have an insulation property, such as silicon dioxide film, TEOS, silicon nitride film, or silicon oxynitride film, for example.

A photoelectric conversion element 11 is formed at the upper side of the insulating film 16. The photoelectric conversion element 11 is formed in such a manner that a transparent electrode sandwiches the top and bottom of the photoelectric conversion film that is sensitive to the light of G. The photoelectric conversion film can employ organic photoelectric conversion materials, such as rhodamine-based dye, merocyanine-based dye, or quinacridone, for example.

Also, in the semiconductor substrate 10, there is formed the through electrode 14 of the taper shape for transferring the electric charge converted in the photoelectric conversion element 11 to the opposite surface side of the semiconductor substrate 10. In the center part of the through electrode 14, the conductor 17 of the constant diameter is formed. The conductor 17 can employ metal materials such as aluminium, tungsten, titanium, cobalt, hafnium, and tantalum, in addition to doped silicon materials such as phosphorus doped amorphous silicon (PDAS), for example.

Further, in a front surface side (the lower side of the drawing) of the semiconductor substrate 10, there are formed an FD 19 for accumulating the electric charge transferred via the through electrode 14 from the photoelectric conversion element 11 and various types of transistors.

The first photoelectric conversion layer 12 and the second photoelectric conversion layer 13 differ in absorption coefficient from each other, and the first photoelectric conversion layer 12 is sensitive to the light of B, and the second photoelectric conversion layer 13 is sensitive to the light of R.

The electric charges generated by the photoelectric conversion in the first photoelectric conversion layer 12 and the second photoelectric conversion layer 13 are accumulated in respective regions, and thereafter is output to the outside by a read circuit (not depicted).

<Second Exemplary Configuration of Back-Side Illuminated Solid-State Image Sensor that Employs Present Disclosure>

Although not depicted, the second exemplary configuration is a case in which there is a spare element area at the front surface side of the semiconductor substrate 10, and there is no spare element area at the back surface side, as opposed to the first exemplary configuration illustrated in FIG. 3. Also, in this case, the outer diameter of the through electrode 14 is formed thick at the front surface side and thin at the back surface side.

<Third Exemplary Configuration of Back-Side Illuminated Solid-State Image Sensor that Employs Present Disclosure>

Figure 4:
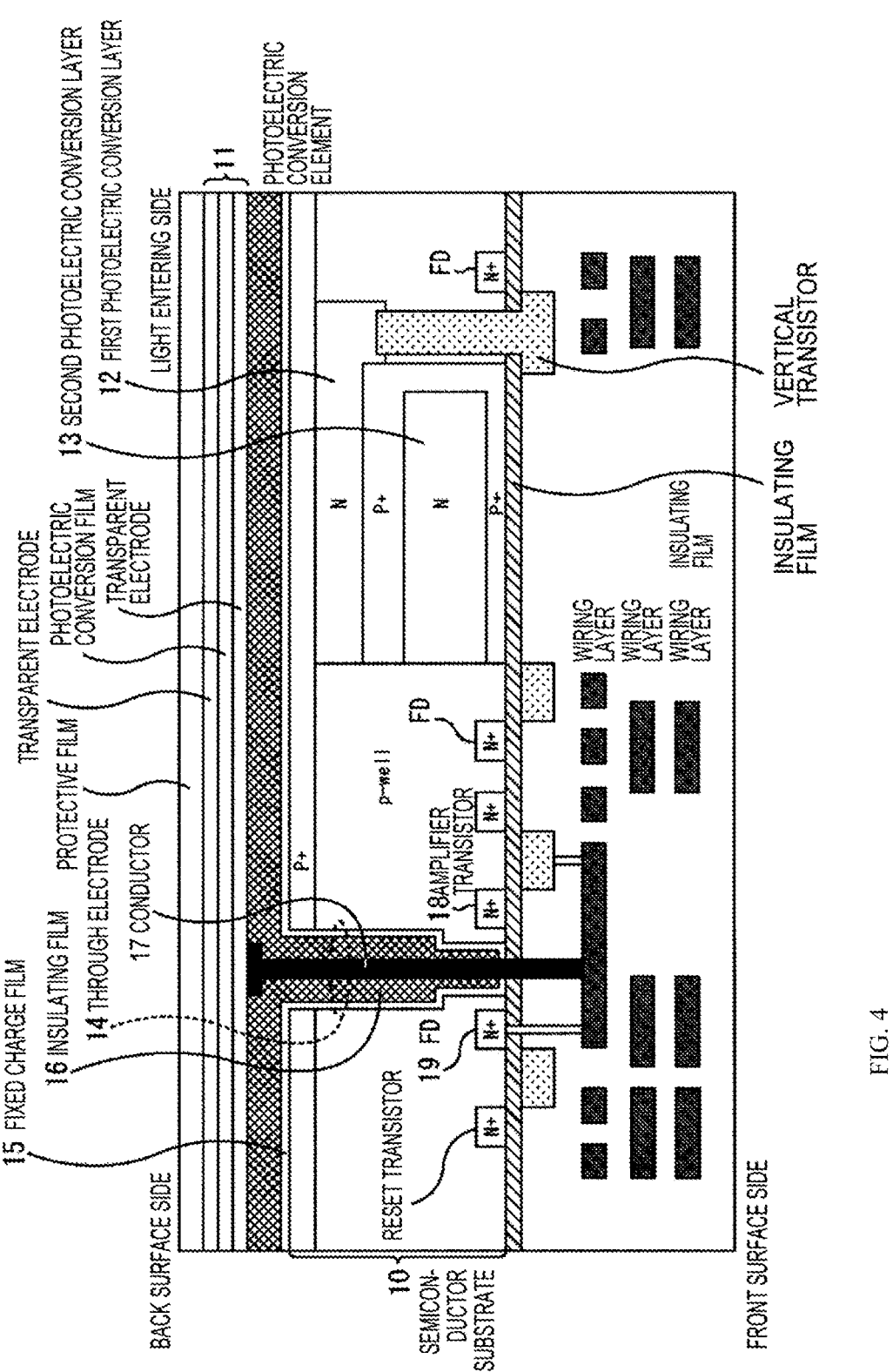
FIG. 4 is a cross-sectional view illustrating a third exemplary configuration of a back-side illuminated solid-state image sensor that employs an embodiment of the present disclosure.

FIG. 4 illustrates a third exemplary configuration, corresponding to one pixel, of the back-side illuminated solid-state image sensor that employs an embodiment of the present disclosure.

The third exemplary configuration illustrated in FIG. 4 differs in the shape of the through electrode 14, as compared with the first exemplary configuration illustrated in FIG. 3. In the third exemplary configuration, the outer diameter of the through electrode 14 is formed in a stepwise (in FIG. 4, 1 step) tapering-off shape. Other components are the same.

When the through hole for forming the through electrode 14 is not formed in the taper shape but in the stepwise tapering-off shape, the substrate crystal orientation of the side wall of the through hole is easily aligned, and thus interface state density is reduced, and white spot and dark current characteristics are improved.

Also, in a production process, the through hole is opened with a wide diameter at the upper surface side, and thus the formation of the fixed charge film 15 and the filling of the insulating film 16 can be performed easily to the front surface of the through hole.

<Fourth Exemplary Configuration of Back-Side Illuminated Solid-State Image Sensor that Employs Present Disclosure>

Although not depicted, a fourth exemplary configuration is a case in which there is a spare element area at the front surface side of the semiconductor substrate 10, and there is no spare element area at the back surface side, as opposed to the third exemplary configuration illustrated in FIG. 4, and in this case, the outer diameter of the through electrode 14 is formed thick at the front surface side and thin at the back surface side.

<Fifth Exemplary Configuration of Back-Side Illuminated Solid-State Image Sensor that Employs Present Disclosure>

Figure 5:
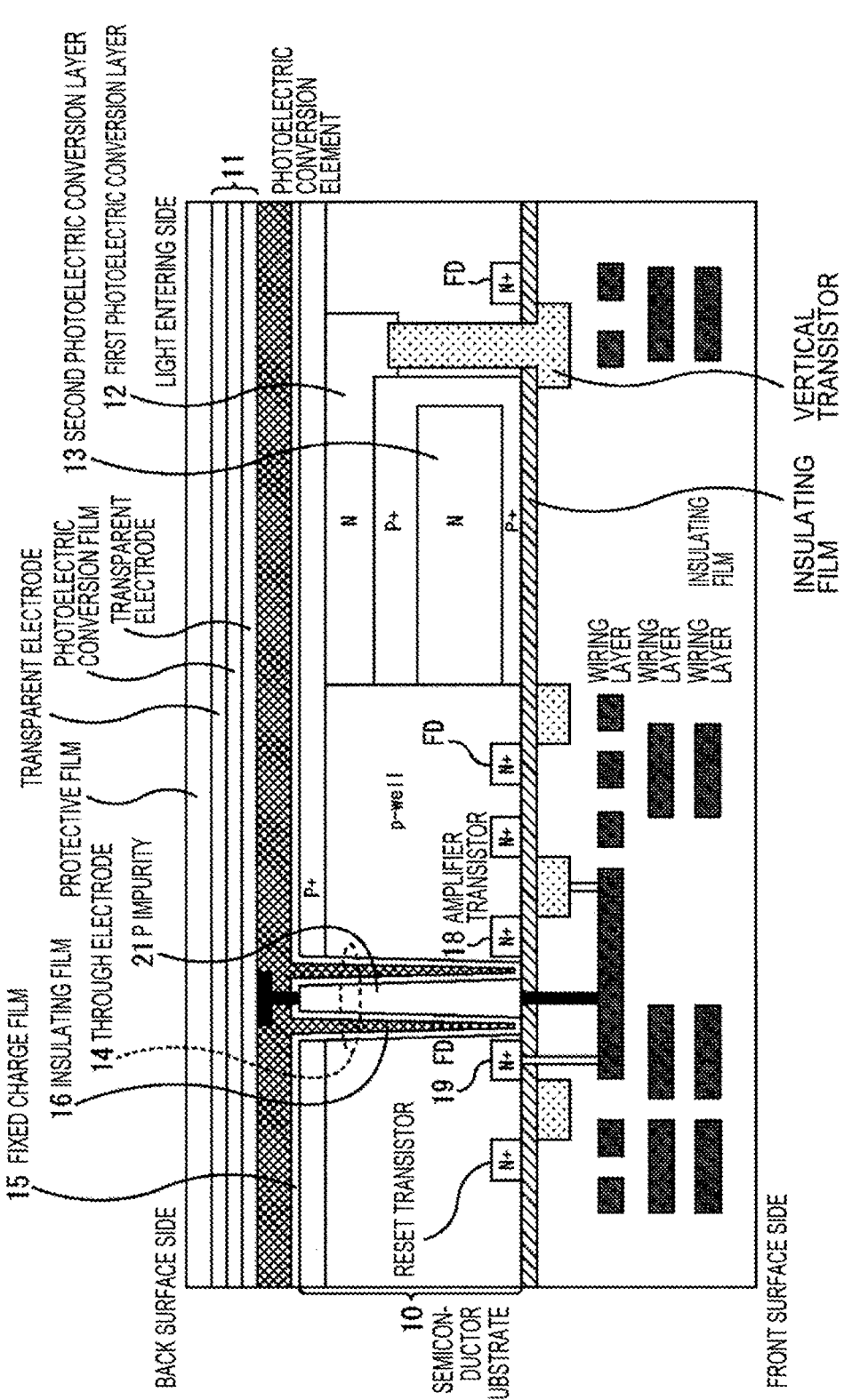
FIG. 5 is a cross-sectional view illustrating a fifth exemplary configuration of a back-side illuminated solid-state image sensor that employs an embodiment of the present disclosure.

FIG. 5 illustrates a fifth exemplary configuration, corresponding to one pixel, of the back-side illuminated solid-state image sensor that employs an embodiment of the present disclosure, which employs the structure of the through electrode 14 illustrated in FIG. 2.

The fifth exemplary configuration illustrated in FIG. 5 differs in the structure of the through electrode 14, as compared with the first exemplary configuration illustrated in FIG. 3, and other components are the same.

That is, in the fifth exemplary configuration, an annular through hole is formed in the semiconductor substrate 10, and the P impurity 21 is doped into the semiconductor part that is left in the taper shape at the center, and thereby the resistance value is reduced, and the conductive part is formed. Also, in the semiconductor part that is left in the taper shape at the center of the annular through hole, a high concentration impurity region for reducing contact resistance is formed by doping the P impurity 21. Further, the P impurity 21 is also doped in the outer wall of the annular through hole, and the fixed charge film 15 is formed together on the upper surface, in order to form a hole storage layer.

The insulating film 16 is formed on the fixed charge film 15. Note that an air gap may be provided at the center part of the insulating film 16 in the through hole.

In the case of the fifth exemplary configuration, the width of a groove of the through hole formed in the ring shape is formed to be wide at the back surface side that has a spare element area, as opposed to the front surface side that has no spare element area, and thus the thickness of the insulating film 16 in the through electrode 14 becomes thick at the back surface side to reduce the electrostatic capacitance. Also, the diameter of the conductive part (the semiconductor in which the P impurity 21 is doped) in the through electrode 14 is formed thin at an R surface side and thick at the front surface side, and thus the overlap margin improves between the contact of the front surface side and (the conductor 17 of) the through electrode 14.

<Sixth Exemplary Configuration of Back-Side Illuminated Solid-State Image Sensor that Employs Present Disclosure>

Although not depicted, a sixth exemplary configuration is a case in which there is a spare element area at the front surface side of the semiconductor substrate 10, and there is no spare element area at the back surface side, as opposed to the fifth exemplary configuration illustrated in FIG. 5. Also, in this case, the outer diameter of the through electrode 14 is formed thick at the front surface side and thin at the back surface side.

<Seventh Exemplary Configuration of Back-Side Illuminated Solid-State Image Sensor that Employs Present Disclosure>

Figure 6:
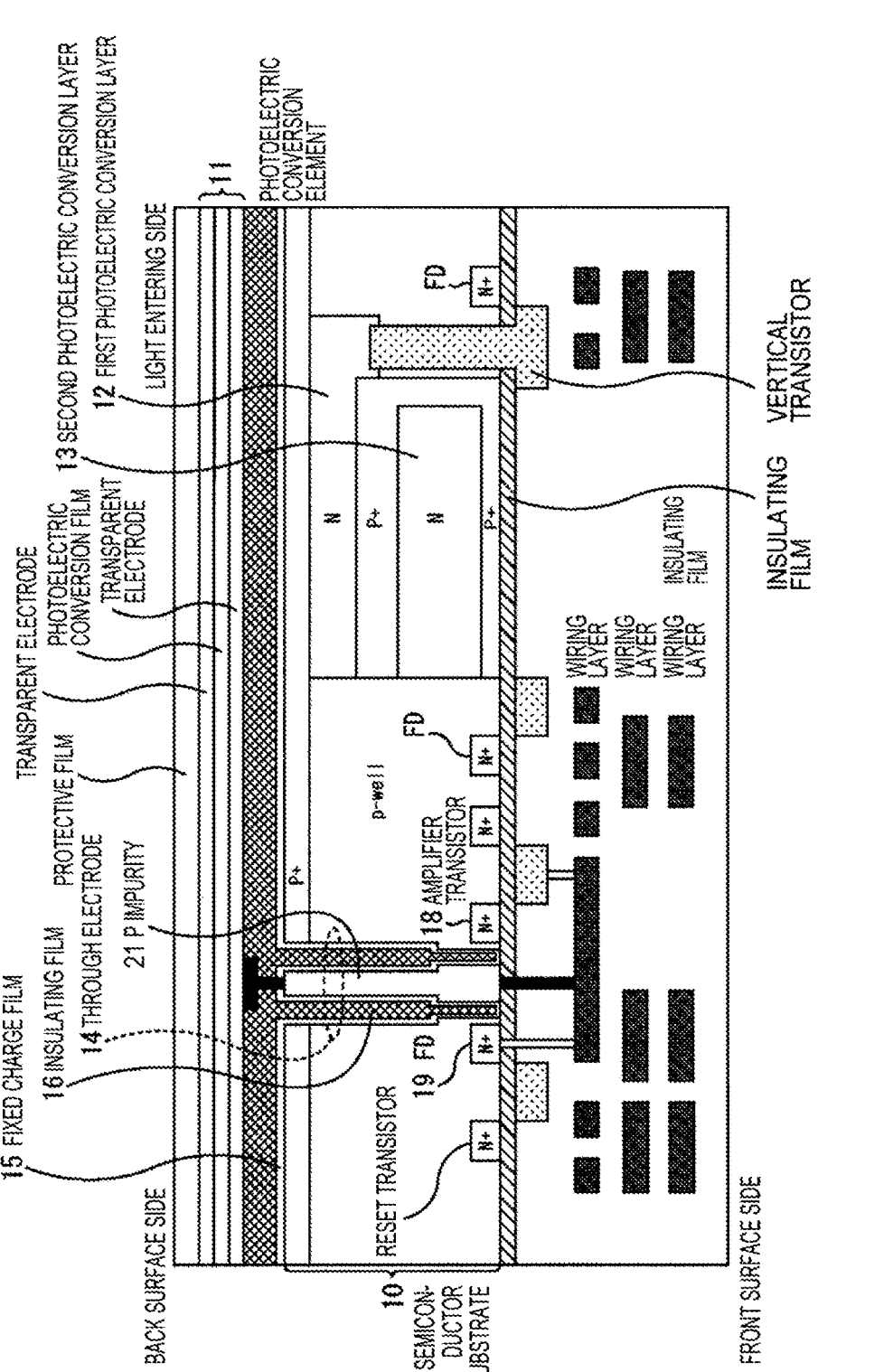
FIG. 6 is a cross-sectional view illustrating a seventh exemplary configuration of a back-side illuminated solid-state image sensor that employs an embodiment of the present disclosure.

FIG. 6 illustrates a seventh exemplary configuration, corresponding to one pixel, of the back-side illuminated solid-state image sensor that employs an embodiment of the present disclosure.

The seventh exemplary configuration illustrated in FIG. 6 differs in the shape of the through electrode 14, as compared with the fifth exemplary configuration illustrated in FIG. 5. In the seventh exemplary configuration, the outer diameter and the inner diameter of the through hole formed in the ring shape are formed in a stepwise (in FIG. 6, 1 step) tapering-off shape. Other components are the same.

When the through hole for forming the through electrode 14 is not the taper shape but the stepwise tapering-off shape, the substrate crystal orientation of the side wall of the through hole is easily aligned, and thus the interface state density is reduced, and the white spot and dark current characteristics can be improved.

<Eighth Exemplary Configuration of Back-Side Illuminated Solid-State Image Sensor that Employs Present Disclosure>

Although not depicted, an eighth exemplary configuration is a case in which there is a spare element area at the front surface side of the semiconductor substrate 10, and there is no spare element area at the back surface side, as opposed to the seventh exemplary configuration illustrated in FIG. 6. Also, in this case, the outer diameter of the through electrode 14 is formed thick at the front surface side and thin at the back surface side.

<Shape of Through Hole that Opens when Through Electrode 14 is Formed>

Figure 7:
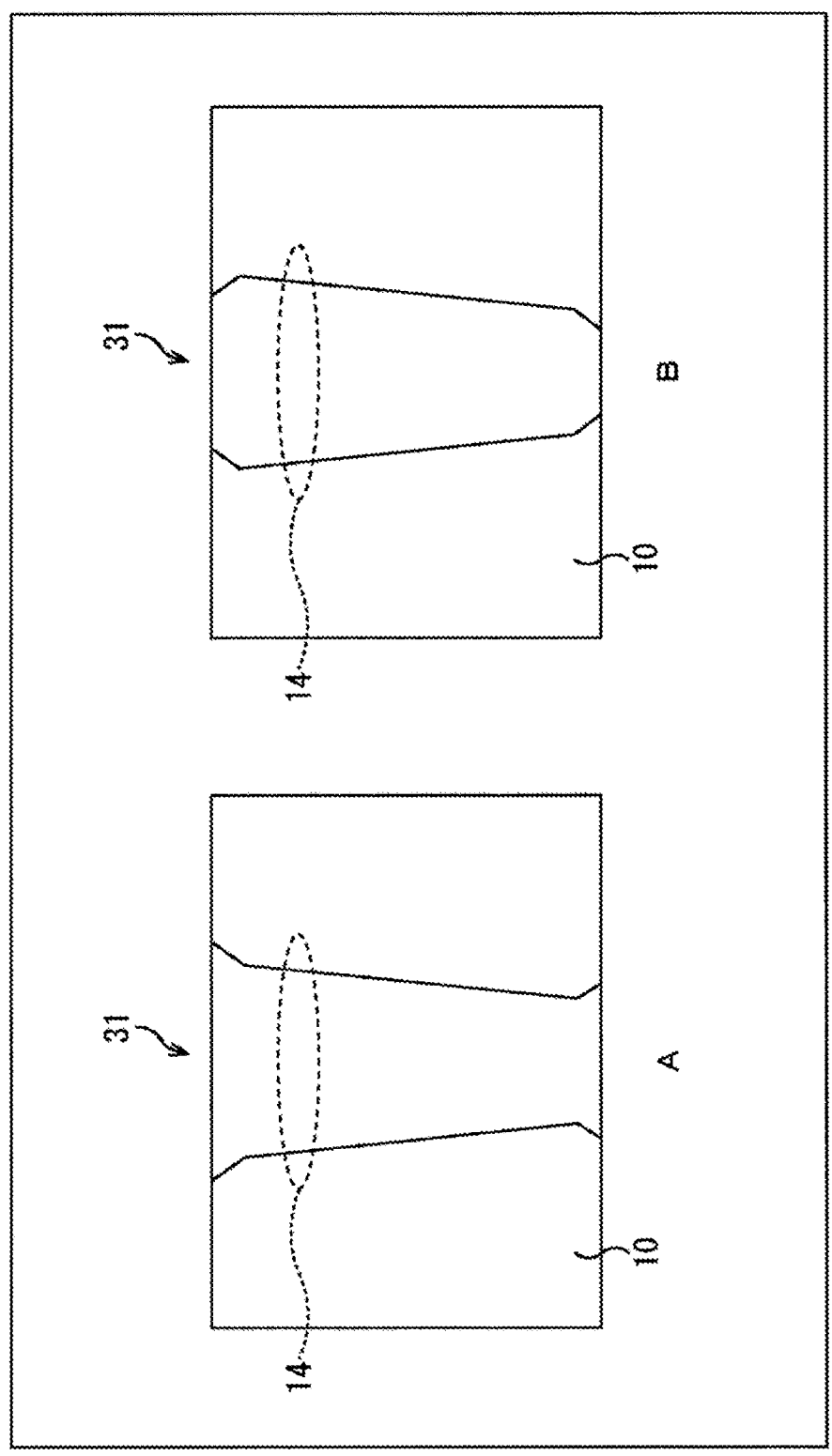
FIG. 7 is a diagram illustrating an exemplary variant of a shape of a through hole that opens when a through electrode is formed.

Thereafter, FIG. 7 illustrates transformation of the shape of the through hole that is opened to form the through electrode 14.

As described above, a through hole 31 that is opened to form the through electrode 14 is formed in the taper shape, but the end portion may be opened more widely, as illustrated in FIG. 7A. Also, on the contrary, the end portion may be opened more narrowly, as illustrated in FIG. 7B. Also, although not depicted, only one of the end portions of the through hole 31 is made wider or narrower. Further, one of the end portions of the through hole 31 may be made wider, while the other end is made narrower.

<Direction of Through Electrode 14 in Taper Shape>

Figure 8A:
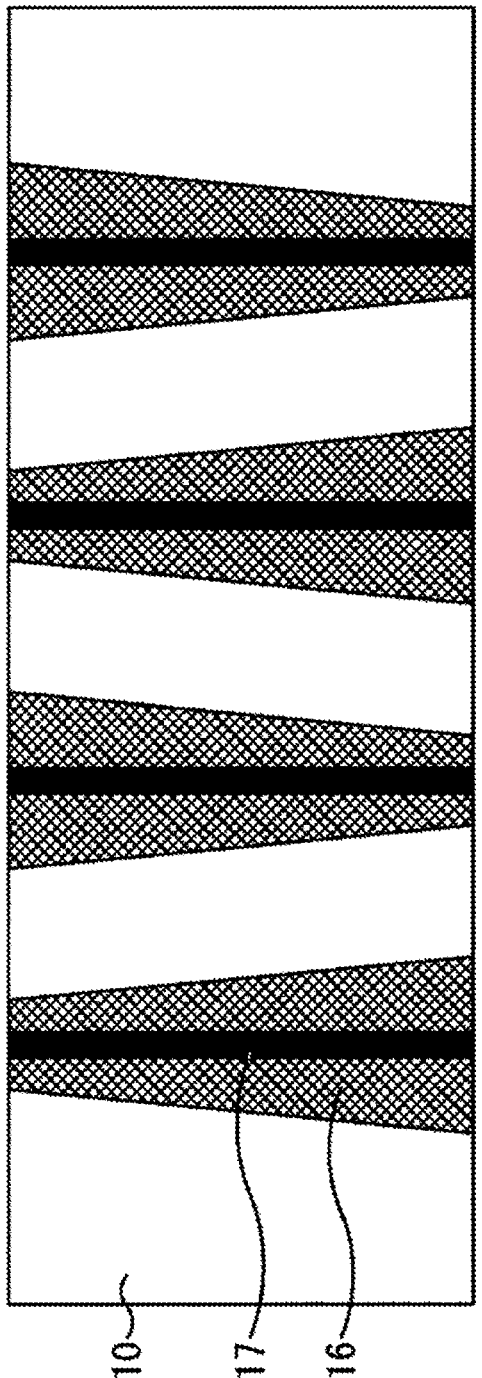
FIG. 8A is a diagram illustrating an exemplary arrangement of a through electrode formed in a taper shape.

The direction of the taper shape does not need to be aligned when a plurality of through electrodes 14 are provided in the semiconductor substrate 10. For example, as illustrated in FIG. 8A, the taper shape may be changed alternately, depending on the presence or absence of the spare element area at the position where the through electrodes 14 are provided in the semiconductor substrate 10. Also, the outer diameters of the through electrodes 14 of the taper shape and the diameters of the conductors 17 formed at the center part do not need to be equal.

Figure 8B:
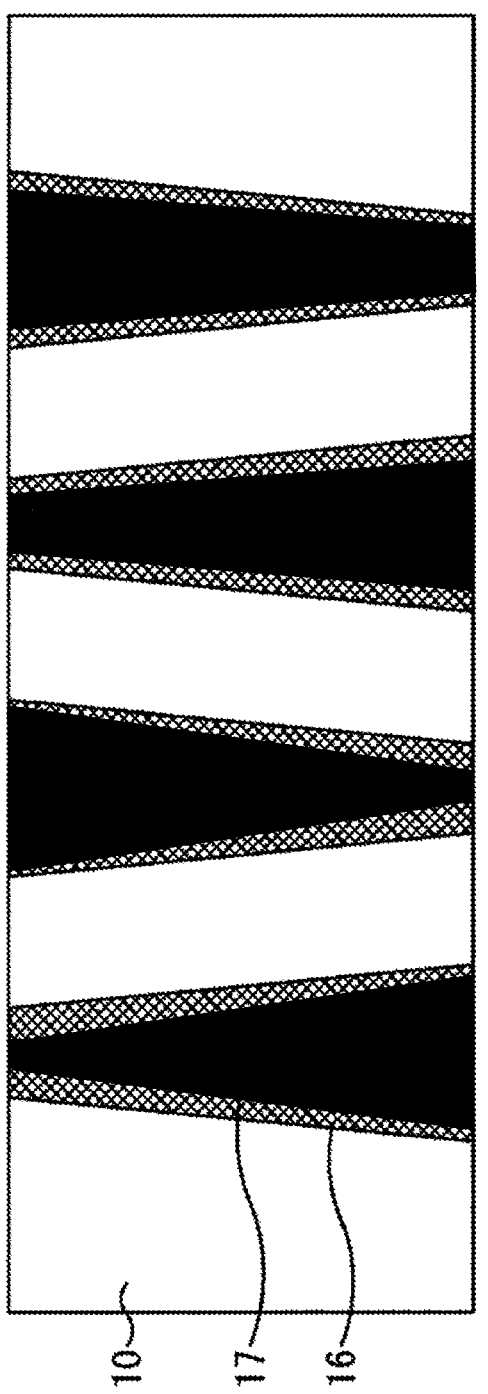
FIG. 8B is a diagram illustrating an exemplary arrangement of a through electrode formed in a taper shape.
Figure 8C:
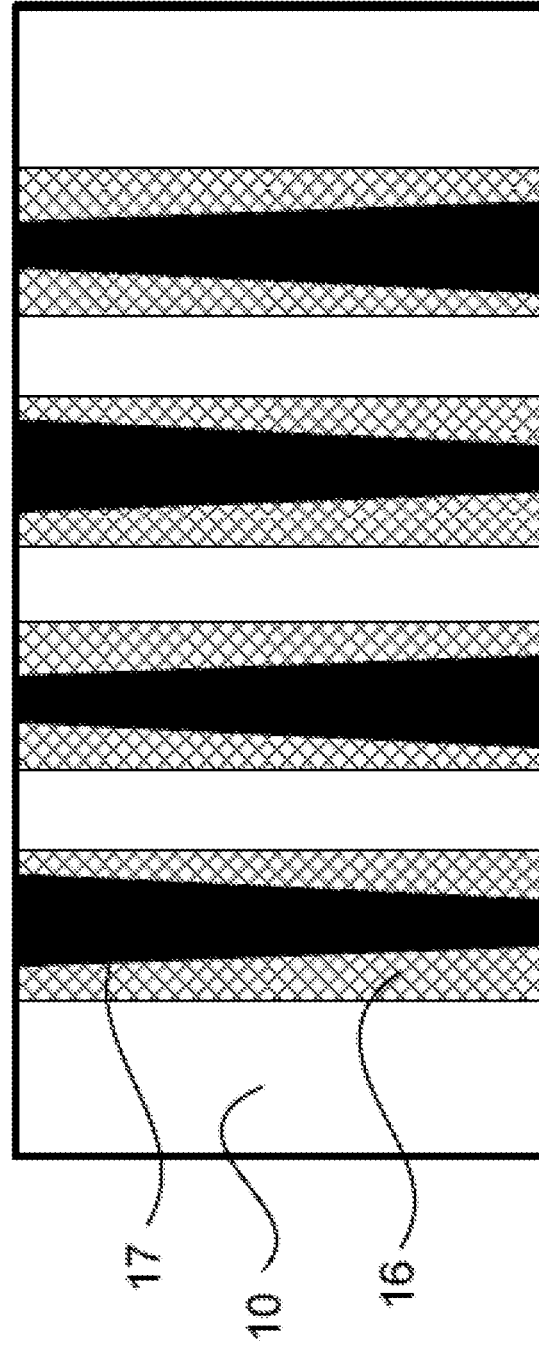
FIG. 8C is a diagram illustrating an exemplary arrangement of a through electrode conductor formed in a taper shape.
Figure 8D:
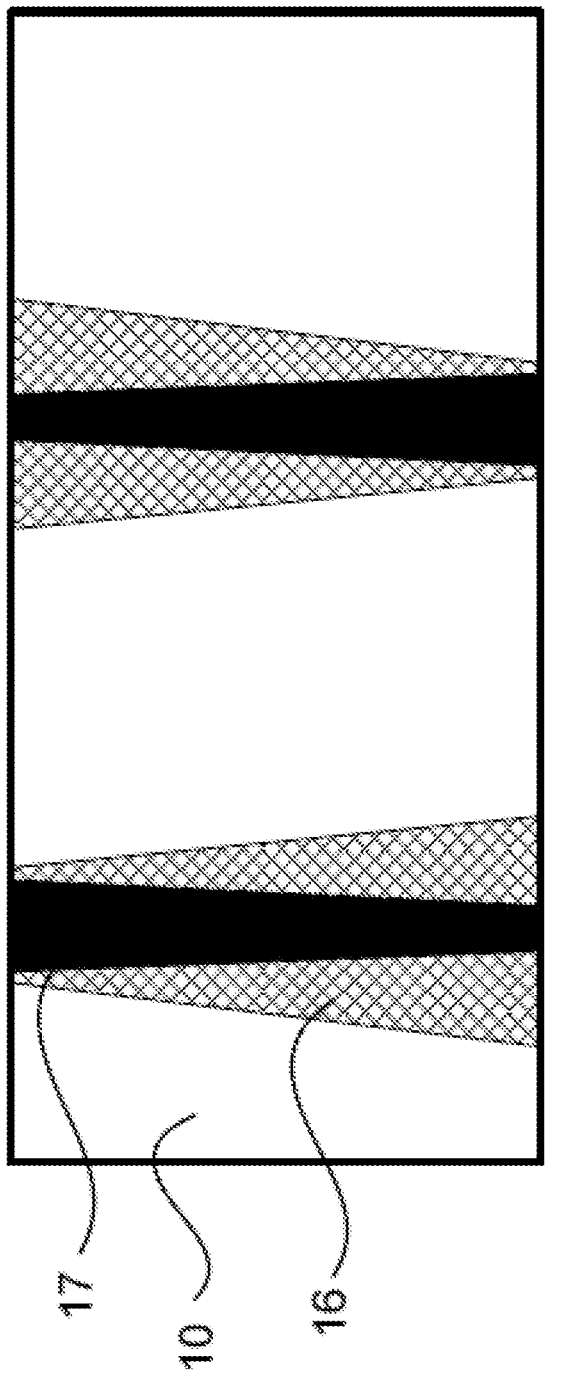
FIG. 8D is a diagram illustrating an exemplary arrangement of a through electrode formed in a taper shape.

Moreover, in some embodiments, one or more components of the through electrode 14 may taper. For example, as illustrated in FIG. 8B, the thickness of the insulation film may remain constant, or about constant. Alternatively, or in addition, the insulating film 16 may taper, the conductor 17 may taper, or both the insulating film 16 and the conductor 17 may taper, as further illustrated in FIG. 8B. As illustrated in FIG. 8C, the through electrode 14 may have a constant, or near constant, width while the conductor 17 may taper. Further, and as illustrated in FIG. 8D, the insulating film 16 may taper in a direction opposite to which the conductor 17 tapers.

<Cross-Sectional Shape in Horizontal Direction of Through Electrode 14>

Figure 9:
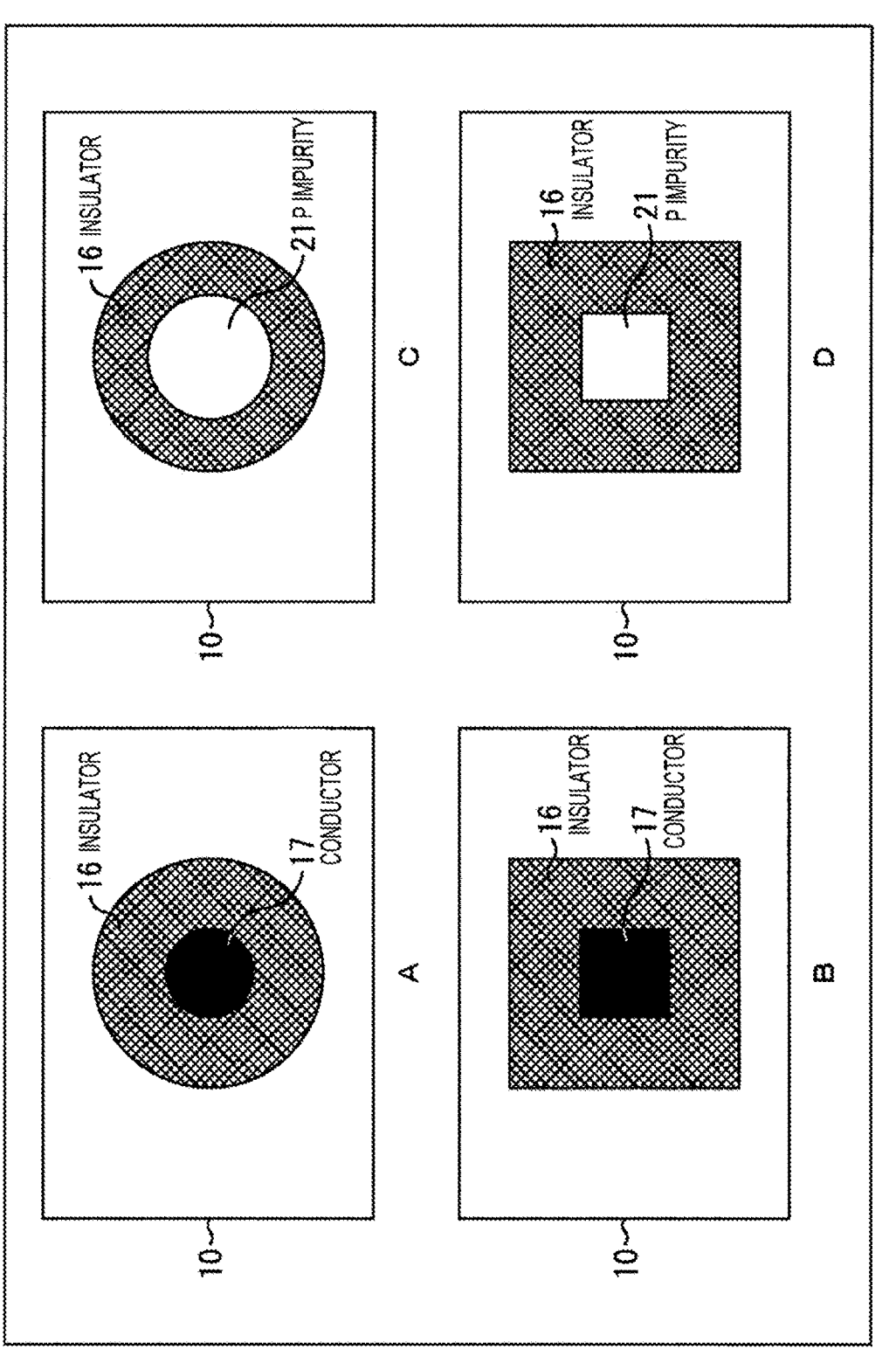
FIG. 9 is a diagram illustrating examples of a cross-sectional shape in a horizontal direction of a through electrode.

FIG. 9 illustrates examples of the cross-sectional shape in the horizontal direction of the through electrode 14.

FIG. 9A and FIG. 9B are the structures formed by filling the through hole with the insulating film 16 and embedding the conductor 17 in the center part of the insulating film 16. FIG. 9A illustrates an example when the cross section in the horizontal direction is a circle, and FIG. 9B illustrates an example when the cross section in the horizontal direction is a rectangle.

FIG. 9C and FIG. 9D are the structures of the conductive part formed by filling the insulating film 16 in the through hole formed in the ring shape and doping the P impurity 21 into the semiconductor that is left at the center part of the through hole. FIG. 9C illustrates an example when the cross section in the horizontal direction is a circle, and FIG. 9D illustrates an example when the cross section in the horizontal direction is a rectangle.

Note that the cross-sectional shape in the horizontal direction of the through electrode 14 is not limited to the illustrated circle or rectangle. Also, the through electrodes 14 of different cross-sectional shapes may be mixed in the same semiconductor substrate 10.

<Production Method of Back-Side Illuminated Solid-State Image Sensor that Employs Present Disclosure>

Next, a production process of the first exemplary configuration of the back-side illuminated solid-state image sensor illustrated in FIG. 3 will be described.

FIGS. 10 to 15 illustrate the production process of the first exemplary configuration of the back-side illuminated solid-state image sensor.

Figure 10:
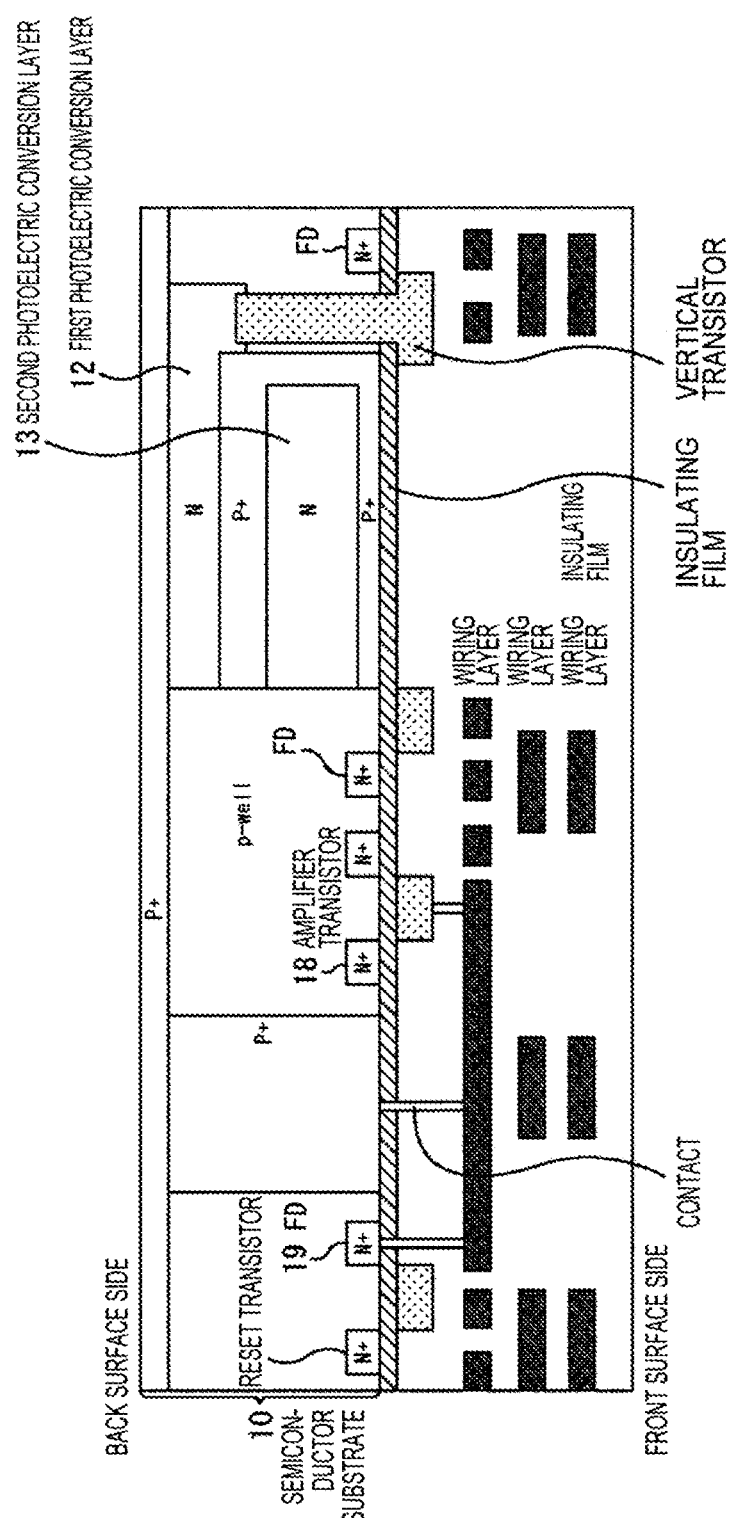
FIG. 10 is a cross-sectional view illustrating a production process of a first exemplary configuration of a back-side illuminated solid-state image sensor that employs an embodiment of the present disclosure.

First, as illustrated in FIG. 10, the first photoelectric conversion layer 12, the second photoelectric conversion layer 13, various types of transistors, and the like are formed in the semiconductor substrate 10 such as a silicon on insulator (SOI) substrate, and then a wiring layer is formed.

Figure 11:
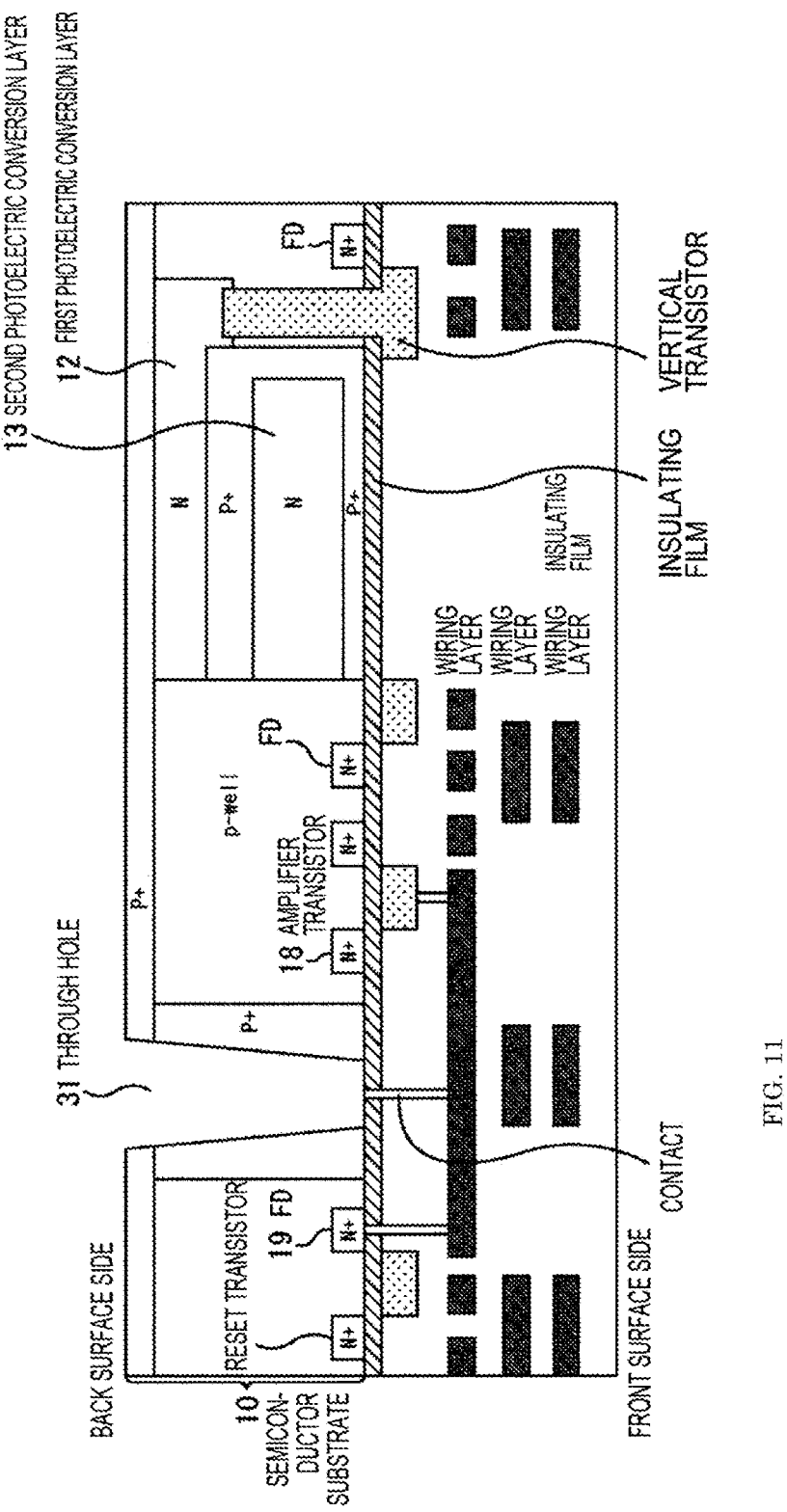
FIG. 11 is a cross-sectional view illustrating a production process of a first exemplary configuration of a back-side illuminated solid-state image sensor that employs an embodiment of the present disclosure.

Thereafter, as illustrated in FIG. 11, the through hole 31 of the taper shape is formed by dry etching or the like from the back surface side, at the position where the through electrode 14 is provided in the semiconductor substrate 10.

Figure 12:
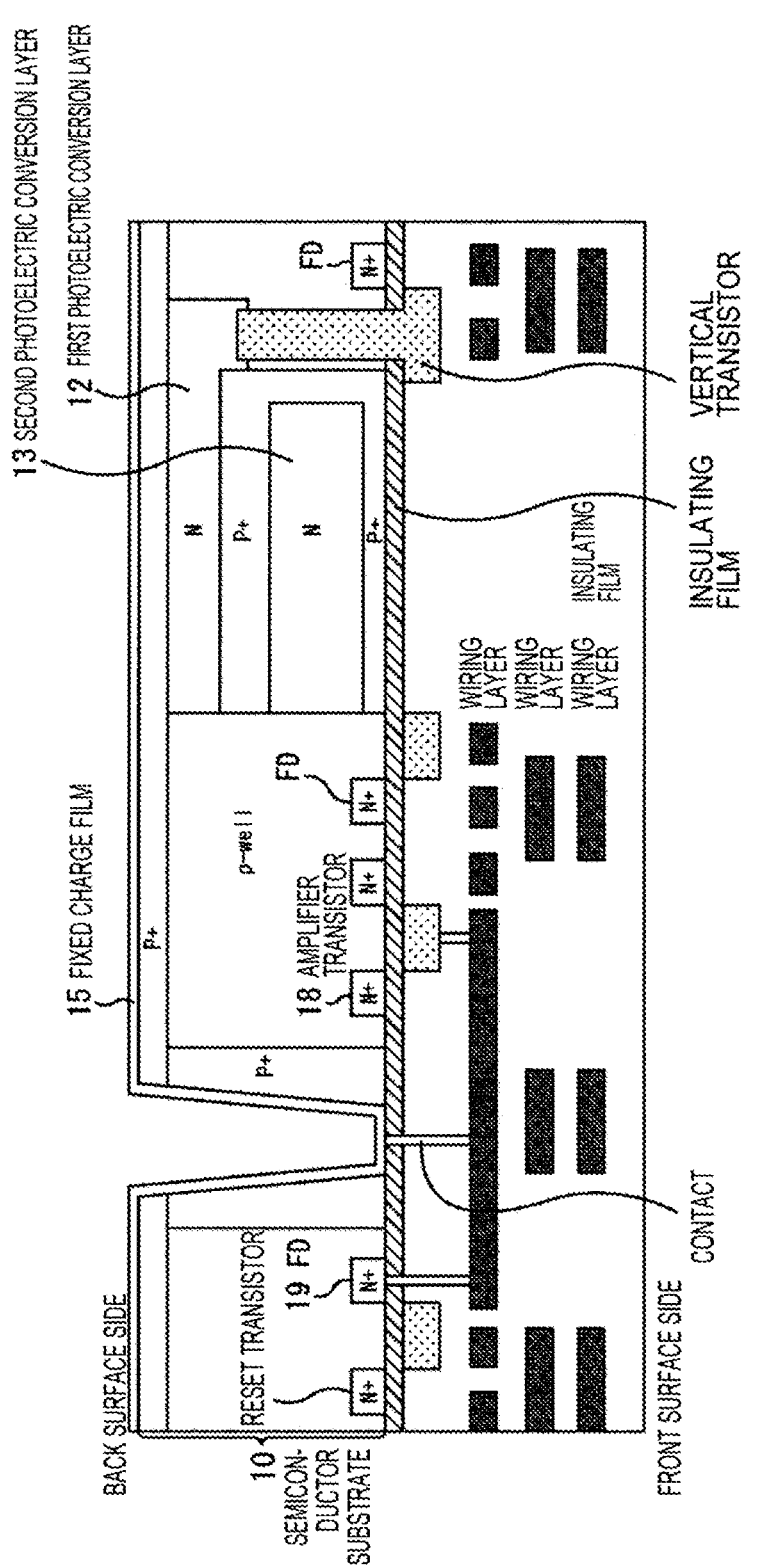
FIG. 12 is a cross-sectional view illustrating a production process of a first exemplary configuration of a back-side illuminated solid-state image sensor that employs an embodiment of the present disclosure.
Figure 13:
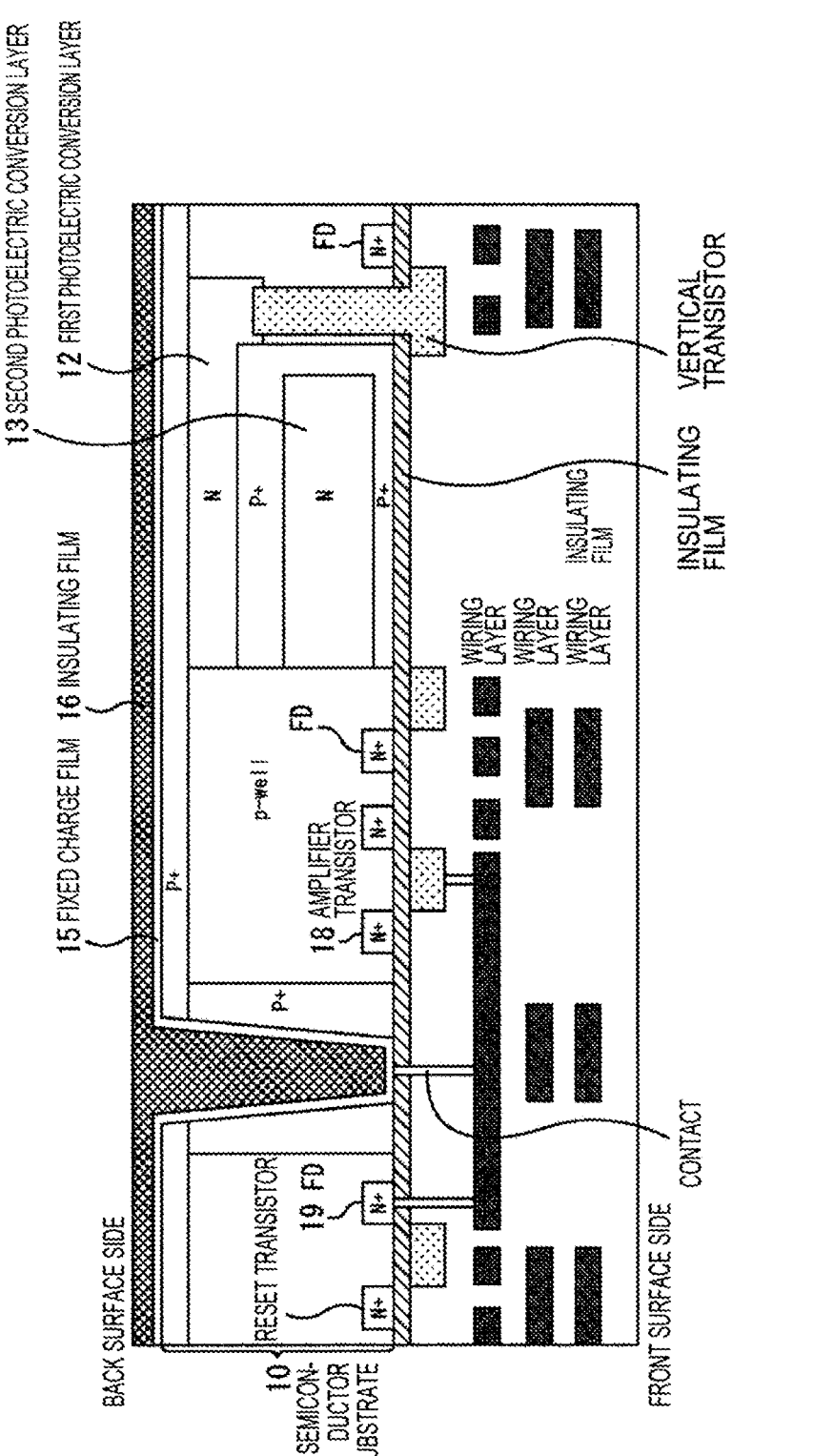
FIG. 13 is a cross-sectional view illustrating a production process of a first exemplary configuration of a back side illuminated solid-state image sensor that employs an embodiment of the present disclosure.

Thereafter, as illustrated in FIG. 12, the fixed charge film 15 is layered on the entire semiconductor substrate 10 that includes the through hole 31, and as illustrated in FIG. 13, the insulating film 16 is layered on the fixed charge film 15 in order to fill the through hole 31.

Figure 14:
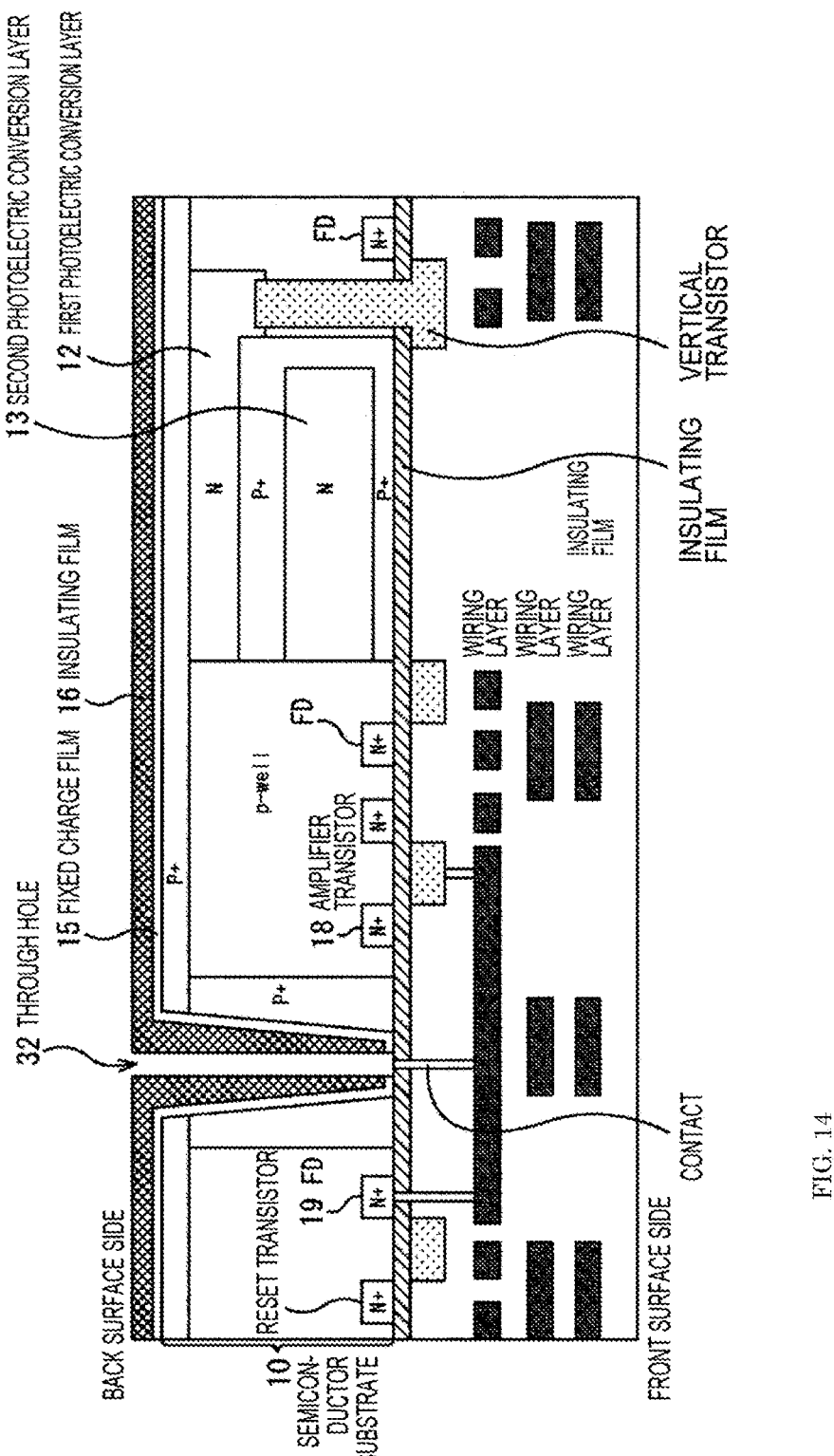
FIG. 14 is a cross-sectional view illustrating a production process of a first exemplary configuration of a back-side illuminated solid-state image sensor that employs an embodiment of the present disclosure.
Figure 15:
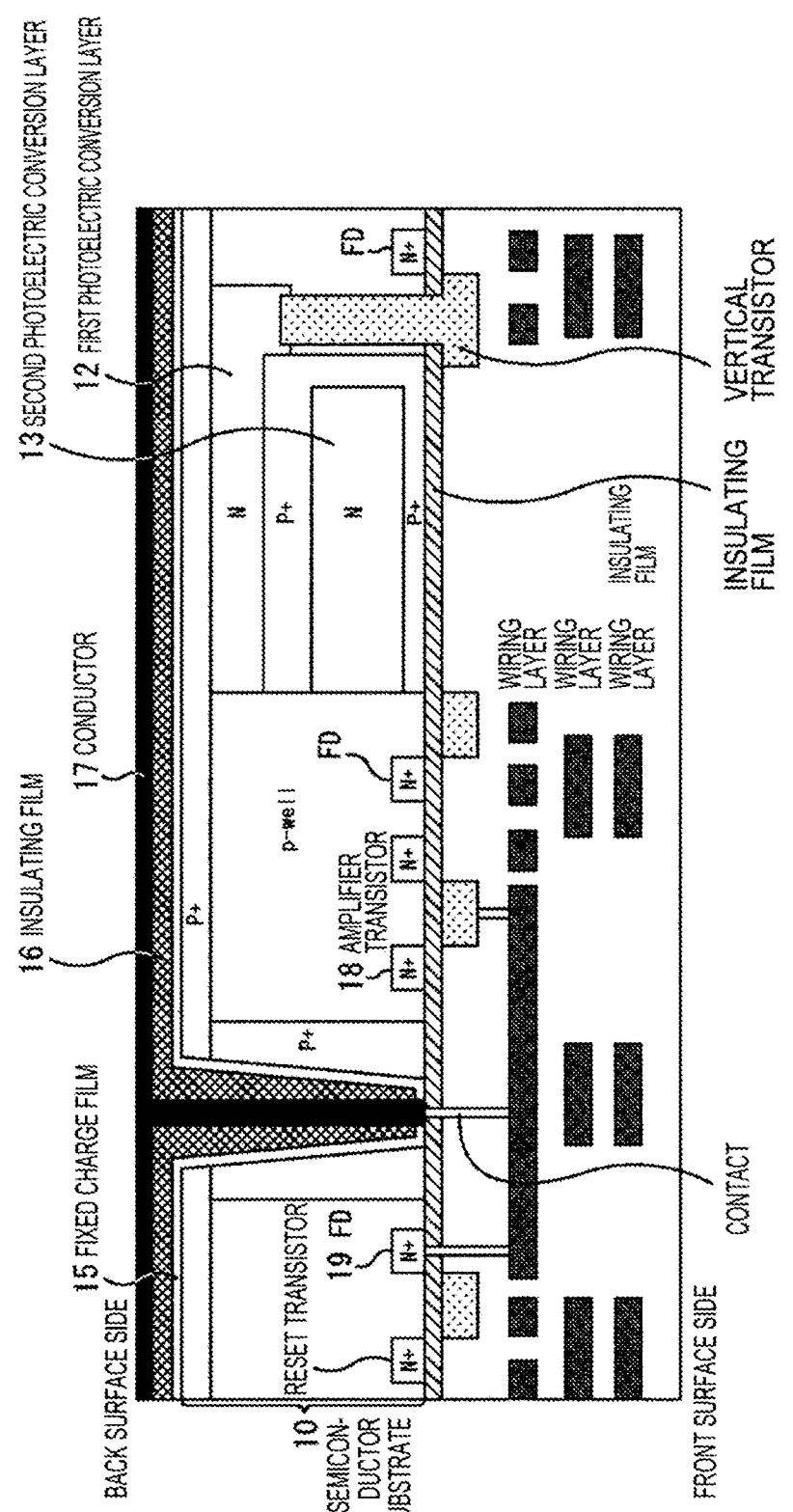
FIG. 15 is a cross-sectional view illustrating a production process of a first exemplary configuration of a back-side illuminated solid-state image sensor that employs an embodiment of the present disclosure.

Thereafter, as illustrated in FIG. 14, the through hole 32 is formed until the through hole 32 reaches the conductor to be connected at the front surface side, at the center part of the insulating film 16 that fills in the through hole 31, and as illustrated in FIG. 15, the conductor 17 is embedded in the through hole 32.

Although not depicted, thereafter, the conductor 17 on the flat surface at the back surface side is polished and removed by CMP, and an oxide film is deposited, and a contact is formed, and the photoelectric conversion element 11 is layered. A protective film such as silicon nitride may be formed at the upper portion of the photoelectric conversion element. Further, an optical member such as a flat film is formed, and an on-chip lens is formed.

The first exemplary configuration of the back side illuminated solid-state image sensor is produced by the process described above. Note that the second to eighth exemplary configurations of the back side illuminated solid-state image sensor can also be produced by adding existing production technologies to the same production method as the following description.

<Usage Example of Back Side Illuminated Solid-State Image Sensor that Employs Present Disclosure>

Figure 16:
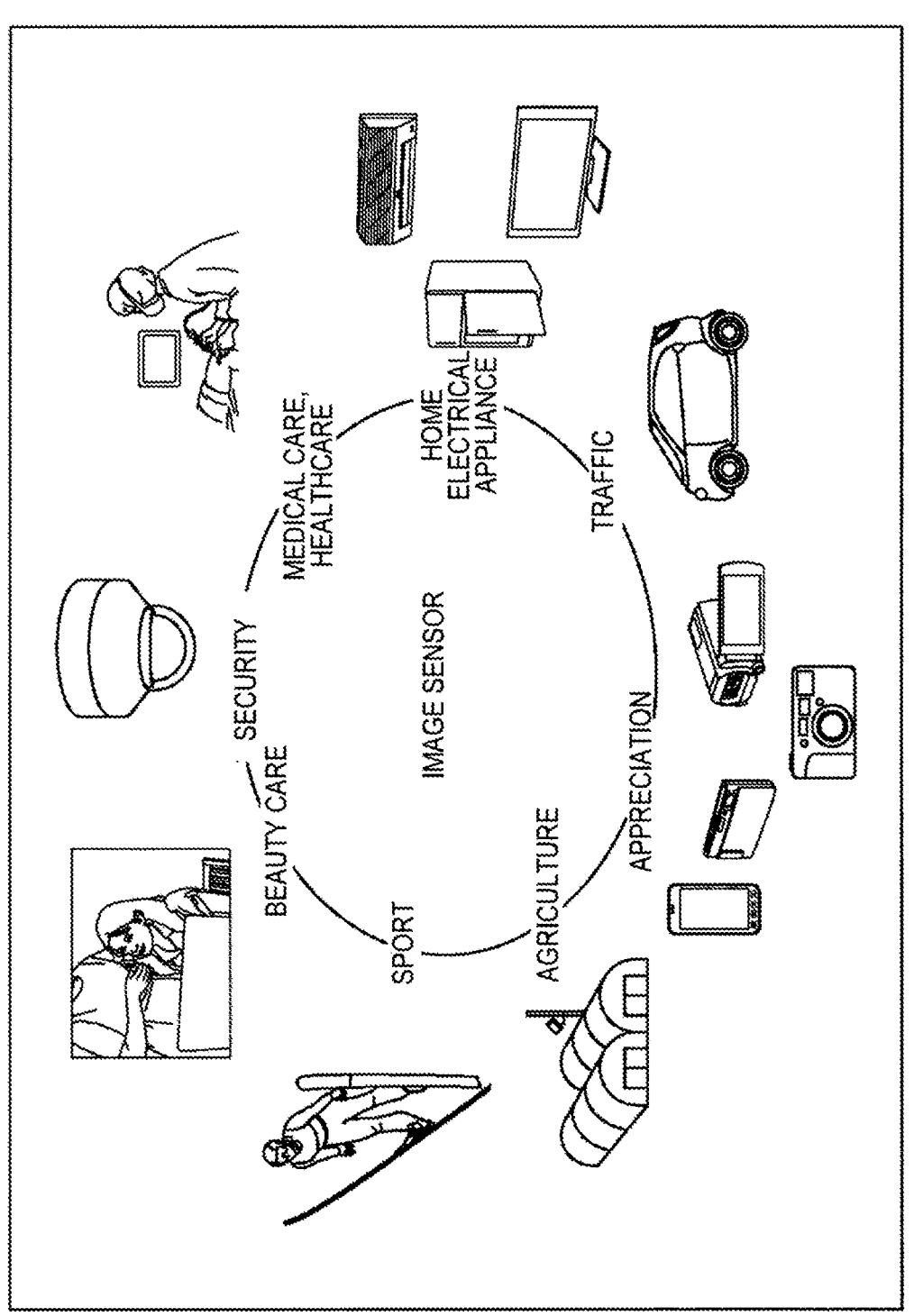
FIG. 16 is a diagram illustrating a usage example of an electronic device that employs an embodiment of the present disclosure.

FIG. 16 is a diagram illustrating a usage example that uses the above back side illuminated solid-state image sensor.

The back side illuminated solid-state image sensor described above can be used in various cases of, for example, sensing light such as visible light, infrared light, ultraviolet light, and X-rays as is described below.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to take images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

Figure 17:
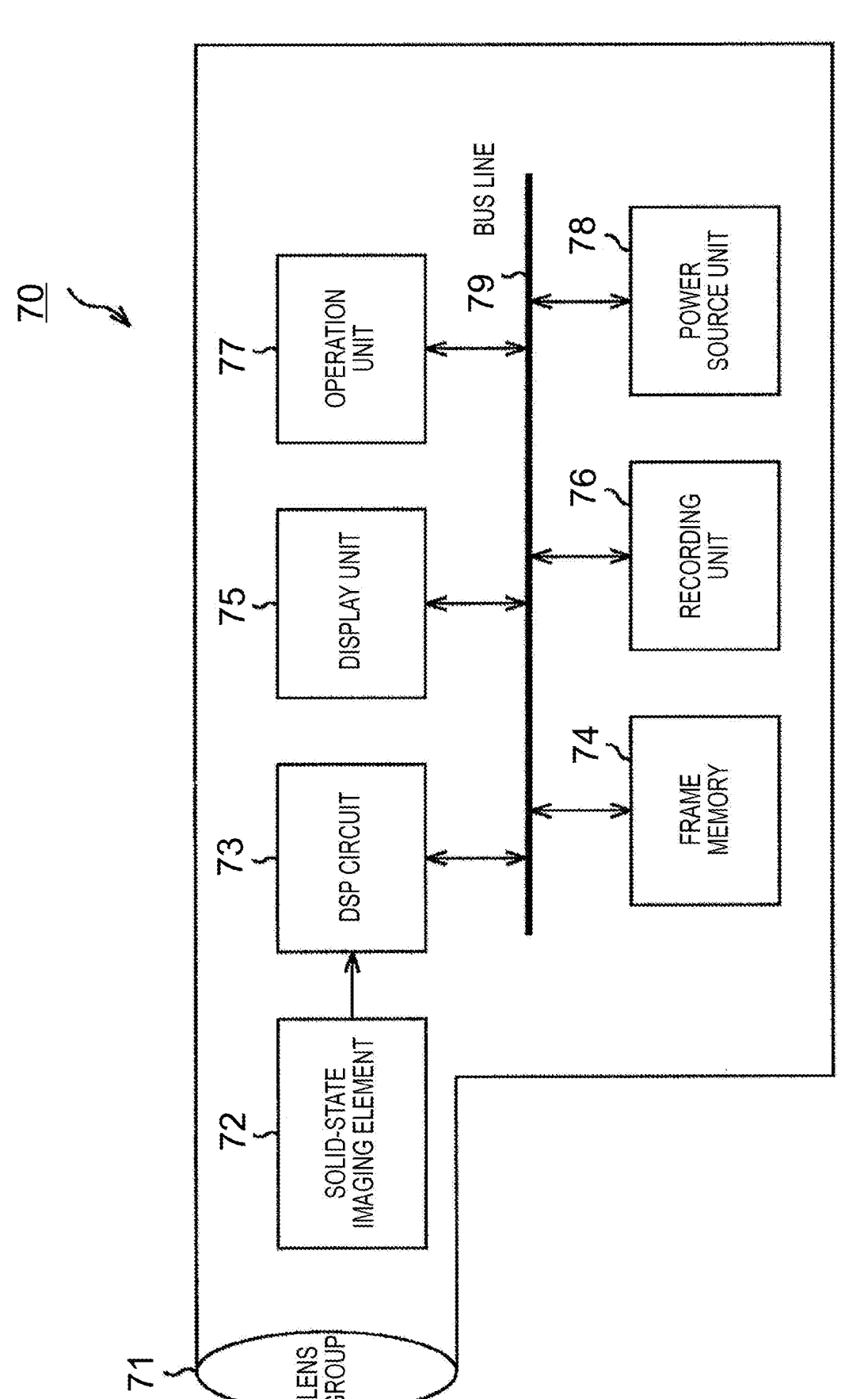
FIG. 17 is a diagram illustrating an electronic device that employs an embodiment of the present disclosure.

FIG. 17 is a block diagram illustrating a configuration example of a camera apparatus, which is an example of an electronic apparatus to which the present technology is applied.

A camera apparatus 70 in FIG. 17 includes an optical unit 71 including a lens group and the like, a solid-state imaging element (imaging element) 72 which employs the above-described respective configurations of the pixels 72, and a DSP circuit 73, which is a camera signal processing circuit. In addition, the camera apparatus 70 includes a frame memory 74, a display unit 75, a recording unit 76, an operation unit 77, and a power supply unit 78. The DSP circuit 73, the frame memory 74, the display unit 75, the recording unit 76, the operation unit 77, and the power supply unit 78 are connected to each other via a bus line 79.

The optical unit 71 receives incident light (image light) from a subject so as to be imaged on an imaging surface of the solid-state imaging element 72. The solid-state imaging element 72 converts a light amount of the incident light, which is imaged on the imaging surface by the optical unit 71, into an electric signal in the unit of a pixel and outputs the electric signal as a pixel signal. The solid-state imaging device related to the above-described embodiments may be used as the solid-state imaging element 72.

The display unit 75 includes, for example, a panel-type display device such as a liquid crystal panel or an organic electroluminescence (EL) panel, and displays moving images or still images captured by the solid-state imaging element 72. The recording unit 76 records moving images or still images captured by the solid-state imaging element 72 on a recording medium such as a video tape or a digital versatile disk (DVD).

The operation unit 77 issues operation commands for various functions of the camera apparatus 70 in response to an operation by a user. The power source unit 78 appropriately supplies a variety of power, which is operation power of the DSP circuit 73, the frame memory 74, the display unit 75, the recording unit 76, and the operation unit 77, to the supply targets.

In addition, embodiments of the present disclosure are not limited to the above-described embodiments, and various alterations may occur insofar as they are within the scope of the present disclosure.

Additionally, the present technology may also be configured as below.

(1)

An imaging device, including:

a semiconductor substrate having a first side and a second side;

a photoelectric conversion element disposed at the first side of the semiconductor substrate; and a through electrode coupled to the photoelectric conversion element, the through electrode including a conductive portion and an insulating film, wherein a thickness of the insulating film between the semiconductor substrate and the conductive portion at the first side of the semiconductor substrate is different than the thickness of the insulting film between the semiconductor substrate and the conductive portion at the second side of the semiconductor substrate.

(2)

The imaging device according to (1), wherein the through electrode penetrates the semiconductor substrate and transfers the electric charge converted by the photoelectric conversion of the photoelectric conversion element to at least one of an amplifier transistor or a floating diffusion formed at the second side of the semiconductor substrate.

(3)

The imaging device according to (1) or (2), wherein the thickness of the insulating film between the semiconductor substrate and the conductive portion gradually changes from the first side of the semiconductor substrate to the second side of the semiconductor substrate.

(4)

The imaging device according to any of (1) to (3), wherein the thickness of the insulating film between the semiconductor substrate and the conductive portion gradually changes having a slope within a range of 90 degrees to 70 degrees from the first side of the semiconductor substrate to the second side of the semiconductor substrate.

(5)

The imaging device according to any of (1) or (2), wherein the thickness of the insulating film between the semiconductor substrate and the conductive portion changes in a stepwise fashion from the first side of the semiconductor substrate to the second side of the semiconductor substrate.

(6)

The imaging device according to any of (1) to (5), wherein the insulating film includes a dielectric having an insulation property.

(7)

The imaging device according to any of (1) to (6), wherein both end portions of the insulating film at the first side of the substrate and the second side of the semiconductor substrate are tapered with respect to non-end portions of the insulating film.

(8)

The imaging device according to any of (1) to (7), wherein the center portion of the through electrode includes at least one of a metal or conductive material.

(9)

The imaging device according to any of (1) to (8), wherein the through electrode is formed for each pixel.

(10)

The imaging device according to any of (1) to (9), wherein a first through electrode in which the thickness of the insulating film between the semiconductor substrate and a first conductive portion at the first side of the semiconductor substrate is thicker than the thickness of the insulting film between the semiconductor substrate and the first conductive portion at the second side of the semiconductor substrate is disposed in the semiconductor substrate, and a second through electrode in which the thickness of the insulating film between the semiconductor substrate and a second conductive portion at the second side of the semiconductor substrate is thicker than the thickness of the insulting film between the semiconductor substrate and the second conductive portion at the first side of the semiconductor substrate is disposed in the semiconductor substrate.

(11)

The imaging device according to any of (1) to (10), wherein the semiconductor substrate includes a plurality of through electrodes having differing diameters.

(12)

The imaging device according to any of (1) to (11), wherein a cross-sectional shape of the through electrode in a horizontal direction is a circle or a rectangle.

(13)

The imaging device according any of (1) to (12), further comprising:

a first photoelectric conversion layer formed in the semiconductor substrate and sensitive to light of a wavelength that differs from a wavelength of light to which the photoelectric conversion element is sensitive; and a second photoelectric conversion layer formed in the semiconductor substrate and sensitive to light of a wavelength that differs from wavelengths of light to which the photoelectric conversion element and the first photoelectric conversion layer are sensitive.

(14)

An electronic device comprising:

an image sensor, the image sensor including:

a semiconductor substrate having a first side and a second side, a photoelectric conversion element disposed at the first side of a semiconductor substrate, and a through electrode coupled to the photoelectric conversion element, the through electrode including a conductive portion and an insulating film, wherein a thickness of the insulating film between the semiconductor substrate and the conductive portion at the first side of the semiconductor substrate is different than the thickness of the insulting film between the semiconductor substrate and the conductive portion at the second side of the semiconductor substrate.

(15)

An imaging device, comprising:

a semiconductor substrate having a first side and a second side;

a photoelectric conversion element disposed at the first side of the semiconductor substrate; and a through electrode coupled to the photoelectric conversion element, the through electrode including a conductive portion and an insulating film, wherein a cross-sectional area of the through electrode at the first side of the semiconductor substrate is different than the cross-sectional area of the through electrode at the second side of the semiconductor substrate.

(16)

The imaging device according to (15), wherein a thickness of the insulating film between the semiconductor substrate and the conductive portion at the first side of the semiconductor substrate is different than the thickness of the insulting film between the semiconductor substrate and the conductive portion at the second side of the semiconductor substrate.

(17)

The imaging device according to (15) or (16), wherein a thickness of the conductive portion at the first side of the semiconductor substrate is different than the thickness of the conductive portion at the second side of the semiconductor substrate.

(18)

The imaging device according to any of (15) to (17), wherein a first through electrode in which the cross-sectional area of the first through electrode at the first side of the semiconductor substrate is greater than the cross-sectional area of the first through electrode at the second side of the semiconductor substrate is disposed in the semiconductor substrate, and a second through electrode in which the cross-sectional area of the second through electrode at the second side of the semiconductor substrate is greater than the cross-sectional area of the second through electrode at the first side of the semiconductor substrate is disposed in the semiconductor substrate.

(19)

A solid state image sensor including:

a photoelectric conversion element formed in one surface side of front and back surfaces of a semiconductor substrate; and a through electrode that penetrates the semiconductor substrate, and is configured to transfer electric charge converted by photoelectric conversion of the photoelectric conversion element to another surface side of the front and back surfaces of the semiconductor substrate, wherein the through electrode includes a center part that transfers the electric charge and an insulating film that surrounds the center part, and the insulating film that forms the through electrode has different thicknesses at one surface and another surface of the semiconductor substrate.

(20)

The solid state image sensor according to (19), wherein the through electrode penetrates the semiconductor substrate, and transfers the electric charge converted by the photoelectric conversion of the photoelectric conversion element, to at least one of an amplifier transistor or a floating diffusion formed at the other surface side of the front and back surfaces of the semiconductor substrate.

(21)

The solid state image sensor according to (19) or (20), wherein the thickness of the insulating film that forms the through electrode gradually changes from the one surface of the semiconductor substrate to the other surface.

(22)

The solid state image sensor according to any of (19) to (21), wherein the thickness of the insulating film that forms the through electrode gradually changes with a slope within a range of 90 degrees to 70 degrees from the one surface of the semiconductor substrate to the other surface.

(23)

The solid state image sensor according to (19) or (20), wherein the thickness of the insulating film that forms the through electrode changes in a stepwise fashion from the one surface of the semiconductor substrate to the other surface.

(24)

The solid state image sensor according to any of (19) to (23), wherein the insulating film that forms the through electrode is made of dielectric that has an insulation property.

(25)

The solid state image sensor according to any of (19) to (24), wherein both end portions of the insulating film that forms the through electrode are formed with a slope that differs from a slope of a straight line part other than the both end portions.

(26)

The solid state image sensor according to any of (19) to (25), wherein the center part of the through electrode is made of metal or conductive material.

(27)

The solid state image sensor according to any of (19) to (26), wherein the through electrode is formed for each pixel.

(28)

The solid state image sensor according to any of (19) to (27), wherein a first through electrode in which the thickness of the insulating film becomes thicker from the one surface of the semiconductor substrate to the other surface, and a second through electrode in which the thickness of the insulating film becomes thicker from the other surface of the semiconductor substrate to the one surface are mixed in the semiconductor substrate.

(29)

The solid state image sensor according to any of (19) to (28), wherein a plurality of the through electrodes that differ in diameter are mixed in the semiconductor substrate.

(30)

The solid state image sensor according to any of (19) to (29), wherein a cross-sectional shape in a horizontal direction of the through electrode is a circle or a rectangle.

(31)

The solid state image sensor according to any of (19) to (30), further including:

a first photoelectric conversion layer formed in the semiconductor substrate, and sensitive to light of a wavelength that differs from a wavelength of light to which the photoelectric conversion element is sensitive; and a second photoelectric conversion layer formed in the semiconductor substrate, and sensitive to light of a wavelength that differs from wavelengths of light to which the photoelectric conversion element and the first photoelectric conversion layer are sensitive.

(32)

An electronic device including a solid state image sensor, the solid state image sensor including a photoelectric conversion element formed in one surface side of front and back surfaces of a semiconductor substrate, and a through electrode that penetrates the semiconductor substrate, and is configured to transfer electric charge converted by photoelectric conversion of the photoelectric conversion element to another surface side of the front and back surfaces of the semiconductor substrate, wherein the through electrode includes a center part that transfers the electric charge and an insulating film that surrounds the center part, and the insulating film that forms the through electrode has different thicknesses at one surface and another surface of the semiconductor substrate.

REFERENCE SIGNS LIST 10 semiconductor substrate
11 photoelectric conversion element
12 first photoelectric conversion layer
13 second photoelectric conversion layer
14 through electrode
15 fixed charge film
16 insulating film
17 conductor
19 FD
21 P impurity
31 through hole
32 through hole

What is claimed is:

1. A light detecting device, comprising:
a semiconductor substrate having a first side and a second side;
a photoelectric conversion element; and a through electrode coupled to the photoelectric conversion element, the through electrode including a conductive portion, an insulating film, and a fixed charge film, wherein the first side of the semiconductor substrate is disposed between the photoelectric conversion element and the second side of the semiconductor substrate, wherein the insulating film is disposed above the fixed charge film in a cross-sectional view, wherein a first portion of the insulating film is disposed above the first side of the semiconductor substrate and a second portion of the insulating film is disposed in the semiconductor substrate, wherein the conductive portion of the through electrode is disposed in the semiconductor substrate, wherein an incline of the second portion of the insulating film is different from an incline of a sidewall of the conductive portion of the through electrode, and wherein the incline of the second portion of the insulating film is less than 90 degrees from the incline of the sidewall of the conductive portion of the through electrode.

2. The light detecting device according to claim 1, wherein the through electrode penetrates the semiconductor substrate and transfers an electric charge converted by the photoelectric conversion element to at least one of an amplifier transistor or a floating diffusion formed at the second side of the semiconductor substrate.

3. The light detecting device according to claim 2, further comprising:

a first photoelectric conversion layer formed in the semiconductor substrate and sensitive to light of a wavelength that differs from a wavelength of light to which the photoelectric conversion element is sensitive; and a second photoelectric conversion layer formed in the semiconductor substrate and sensitive to light of a wavelength that differs from wavelengths of light to which the photoelectric conversion element and the first photoelectric conversion layer are sensitive.

4. The light detecting device according to claim 1, wherein the insulating film includes a dielectric having an insulation property.

5. The light detecting device according to claim 1, wherein a center portion of the through electrode includes at least one of a metal or conductive material.

6. The light detecting device according to claim 1, wherein the through electrode comprises a plurality of through electrodes, and wherein each through electrode is formed for each pixel of a plurality of pixels.

7. The light detecting device according to claim 1, wherein a cross-sectional shape of the through electrode in a horizontal direction is a circle or a rectangle.

8. The light detecting device according to claim 1, wherein the insulating film is disposed directly above the fixed charge film in the cross-sectional view.

9. The light detecting device according to claim 1, wherein the second portion of the insulating film and the sidewall of the conductive portion are disposed in a same depth.

10. The light detecting device according to claim 1, wherein the through electrode is connected to a plurality of pixels.

11. The light detecting device according to claim 1, wherein a plurality of through electrodes includes the through electrode coupled to the photoelectric conversion element.

12. The light detecting device according to claim 1, wherein the conductive portion of the through electrode is a constant diameter.

13. The light detecting device according to claim 1, wherein the second portion of the insulating film is a tapered shape in the cross-sectional view.

14. An electronic device comprising:

a solid-state image sensor, the solid-state image sensor including:

a semiconductor substrate having a first side and a second side;

a photoelectric conversion element; and a through electrode coupled to the photoelectric conversion element, the through electrode including a conductive portion, an insulating film, and a fixed charge film, wherein the first side of the semiconductor substrate is disposed between the photoelectric conversion element and the second side of the semiconductor substrate, wherein the insulating film is disposed above the fixed charge film in a cross-sectional view, wherein a first portion of the insulating film is disposed above the first side of the semiconductor substrate and a second portion of the insulating film is disposed in the semiconductor substrate, wherein the conductive portion of the through electrode is disposed in the semiconductor substrate, wherein an incline of the second portion of the insulating film is different from an incline of a sidewall of the conductive portion of the through electrode, and wherein the incline of the second portion of the insulating film is less than 90 degrees from the incline of the sidewall of the conductive portion of the through electrode.

15. The electronic device according to claim 14, wherein the through electrode penetrates the semiconductor substrate and transfers an electric charge converted by the photoelectric conversion element to at least one of an amplifier transistor or a floating diffusion formed at the second side of the semiconductor substrate.

16. The electronic device according to claim 14, wherein the insulating film includes a dielectric having an insulation property, and wherein a center portion of the through electrode includes at least one of a metal or conductive material.

17. The electronic device according to claim 14, wherein a cross-sectional shape of the through electrode in a horizontal direction is a circle or a rectangle.

18. The electronic device according to claim 14, further comprising:

a first photoelectric conversion layer formed in the semiconductor substrate and sensitive to light of a wavelength that differs from a wavelength of light to which the photoelectric conversion element is sensitive; and a second photoelectric conversion layer formed in the semiconductor substrate and sensitive to light of a wavelength that differs from wavelengths of light to which the photoelectric conversion element and the first photoelectric conversion layer are sensitive.

19. An imaging device, comprising:

a semiconductor substrate having a first side and a second side;

a photoelectric conversion element; and a plurality of through electrodes directly coupled to the photoelectric conversion element, each through electrode of the plurality of through electrodes including a conductive portion, an insulating film, and a fixed charge film, wherein the first side of the semiconductor substrate is disposed between the photoelectric conversion element and the second side of the semiconductor substrate, wherein the insulating film is disposed above the fixed charge film in a cross-sectional view, wherein a first portion of the insulating film is disposed above the first side of the semiconductor substrate and a second portion of the insulating film is disposed in the semiconductor substrate, wherein the conductive portion of the through electrode is disposed in the semiconductor substrate, wherein an incline of the second portion of the insulating film is different from an incline of a sidewall of the conductive portion of each through electrode, and wherein the incline of the second portion of the insulating film is less than 90 degrees from the incline of the sidewall of the conductive portion of the through electrode.

20. The imaging device according to claim 19, wherein the through electrode comprises a plurality of through electrodes, and wherein each through electrode is formed for each pixel of a plurality of pixels.

\* \* \* \* \*